United States Patent [19]
Li et al.

[11] Patent Number: 6,026,168
[45] Date of Patent: Feb. 15, 2000

[54] METHODS AND APPARATUS FOR AUTOMATICALLY SYNCHRONIZING AND REGULATING VOLUME IN AUDIO COMPONENT SYSTEMS

[75] Inventors: Xu Li, Cerritos; Elliot M. Rubin, Santa Monica; Xiaofeng Shou, Los Angeles, all of Calif.

[73] Assignee: Microtek Lab, Inc., Redondo Beach, Calif.

[21] Appl. No.: 08/970,872

[22] Filed: Nov. 14, 1997

[51] Int. Cl.$^7$ .................................................. H04R 5/00
[52] U.S. Cl. .......................... 381/28; 381/107; 381/120; 381/1
[58] Field of Search ..................... 381/120, 121, 381/28, 109, 104, 102, 108, 57, 119, 17, 18, 1, 107

[56] References Cited

U.S. PATENT DOCUMENTS

| | | | |
|---|---|---|---|
| 5,134,658 | 7/1992 | Chen et al. | 381/121 |
| 5,400,410 | 3/1995 | Muraki et al. | 381/107 |
| 5,402,500 | 3/1995 | Sims, Jr. | 381/119 |

*Primary Examiner*—Ping Lee
*Attorney, Agent, or Firm*—Erik K. Satermo

[57] ABSTRACT

A signal regulator regulates an auxiliary signal based upon a primary signal scaled by an external amplifier. The signal regulator receives the primary signal with an unscaled level. Processing circuitry monitors the unscaled level of the primary signal. The primary signal is then output to the external amplifier for scaling, either by amplification or attenuation. The primary signal with a scaled level is in turn received by the signal regulator from the amplifier. The processing circuitry monitors the scaled level of the primary signal from the amplifier, and then generates a gain factor based upon the unscaled level and the scaled level of the primary signal. An auxiliary signal is received by the signal regulator. Adjusting circuitry receives the gain factor from the processing circuitry and adjusts a level of the auxiliary signal based upon the gain factor. The auxiliary signal with the adjusted level is then provided to an external component, for example, a loudspeaker. The signal regulator is particularly useful in regulating the volume of auxiliary audio channels in a surround-sound system based upon the volume of the main or front channels amplified by an audio/video receiver. The signal regulator performs system delay measurements, phase synchronization of the unscaled and scaled primary signals, volume tracking, and consecutive cross-correlation measurements to safe guard against erroneous volume adjustment.

22 Claims, 9 Drawing Sheets

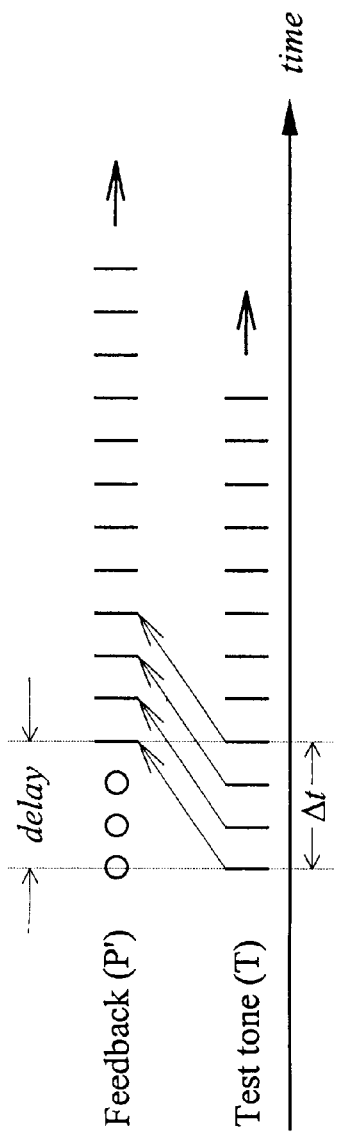
FIG. 7
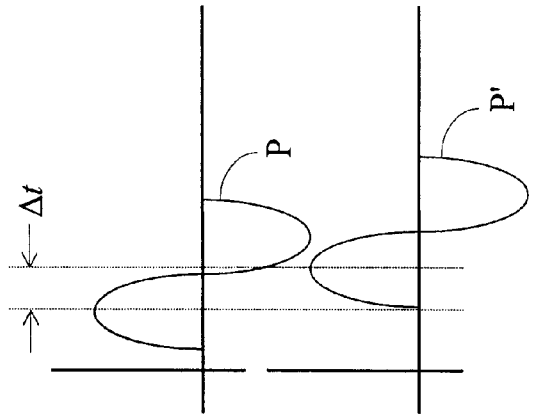
FIG. 9
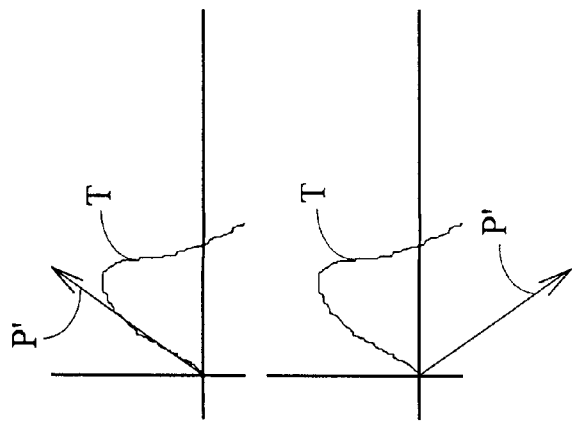
FIG. 8A
FIG. 8B

METHODS AND APPARATUS FOR AUTOMATICALLY SYNCHRONIZING AND REGULATING VOLUME IN AUDIO COMPONENT SYSTEMS

FIELD OF THE INVENTION

The present invention is directed to electronic components for monitoring signals and for adjusting a gain of signals. More particularly, the present invention is directed to methods and associated apparatus for regulating the volume of auxiliary audio channels based upon externally amplified main or front channels in an audio system. The apparatus of the present invention adjusts the volume of auxiliary audio channels in response to a change in volume of the main or front channels caused by an external receiver with an amplifier.

BACKGROUND OF THE INVENTION

Of the latest trends in the consumer electronics industry, none is more vibrant than the sales of home theater systems. Electronics manufacturers are continuously improving audio/video (A/V) receivers which are specialized for the multiple channels required to produce a theater-like surround-sound system. Most receivers being sold on the market are capable of providing Dolby Pro Logic® surround sound, which is an analog system. Dolby Laboratories has recently developed Dolby Digital®, which is a digital system and superior to the analog system. Consumers with relatively old receivers which do not have surround-sound capabilities need to purchase an additional component to attach to their existing receiver to upgrade to Dolby Pro Logic®. Similarly, consumers owning an existing receiver with or without Dolby Pro Logic® capabilities need to purchase an additional component to upgrade to Dolby Digital®. (Dolby Pro Logic® and Dolby Digital® are registered trademarks of Dolby Laboratories.)

A typical home-theater system includes an A/V receiver to which a number of audio and video components may be attached. These components may include a video cassette recorder (VCR), a digital video disc (DVD) player, a television (e.g., a high-definition or a digital television), a compact disc (CD) player, a tape deck, a tuner, a phonograph, an auxiliary amplifier, and an upgrade component to provide surround sound. As for outputs, which are typically connected to loudspeakers, conventional A/V receivers have two main or front channels (right and left) as well as a number of surround-sound channels, including rear right and left channels, a center channel, and a sub-woofer. If a user is listening to the radio through the tuner, then the A/V receiver provides audio output on the front right and left channels. If the user switches to an input with surround-sound capabilities, such as a DVD player, then the A/V receiver provides audio output on the surround-sound channels in addition to the front right and left channels.

One of the difficulties in installing a home-theater system is the compatibility of the existing A/V receiver with the surround-sound components. For example, if a user is listening to an audio signal from a tuner and adjusts the volume (of the front channel speakers) to a comfortable listening level and then switches to a digital surround-sound signal from DVD player, then the level of the audio signal provided to the front channel speakers will be disproportionately higher (or lower) than the level of the digital audio signal provided to the surround-sound speakers. The resulting surround-sound effect will not be balanced or harmonious. To compensate for the disproportionality, a user needs to manually adjust or align the volume control of the A/V receiver with the surround-sound components in order to balance the levels of the multiple surround-sound speakers with the levels of the front channels. This balance of the front speakers with the surround-sound speakers is often an inexact science, in that the user goes by ear, or by what sounds good to him or her, in adjusting the volume level. After adjusting the volume of the A/V receiver, the user then will adjust the volume of the surround-sound environment (including the front right and left channels) through the surround-sound upgrade component, not through the A/V receiver.

These existing systems share a number of drawbacks and disadvantages. For example, each time a user switches from a "regular" two-channel signal (e.g., from a tuner, a tape deck, a phonograph, etc.) to a multiple-channel surround-sound signal, then the volume control of the A/V receiver needs to be adjusted to the predetermined level in order to balance the levels of the front speakers with the levels of the surround-sound speakers. Two remote controls are often needed to perform this volume balancing routine. In addition, the predetermined level of the A/V receiver is set subjectively by an individual user; however, not all of the viewers enjoying an evening of home theater may share the belief that one predetermined level is best.

Accordingly, in view of the foregoing, it is an object of the present invention to provide apparatus and associated methods for mediating and/or obviating the above-mentioned drawbacks of conventional home-theater systems.

It is another object of the present invention to provide apparatus and associated methods for automatically monitoring and adjusting the volume of the surround-sound channels in a home-theater system.

It is yet another object of the present invention to provide a signal regulator which balances the volume level of primary channels and auxiliary channels based on electrical accuracy, rather than on human subjectivity.

It is a further object of the invention to provide a signal regulator for adjusting the level of an auxiliary signal based upon an amplified level of a primary signal.

It is still another object of the present invention to provide a volume-tracking system which only adjusts the volume of auxiliary signals when there is a strong correlation between a signal used as a reference and feedback signal to prevent erroneous volume adjustment.

SUMMARY OF THE INVENTION

These and other objects are achieved by the methods and apparatus of the present invention. The invention provides a signal regulator which tracks the volume level of a main channel of an audio signal which is scaled by an external amplifier. Generally speaking, the signal regulator adjusts the volume level of an auxiliary channel in response to changes in the volume level of the main channel.

In accordance with one aspect of the present invention, a signal regulator regulates an auxiliary signal based upon a primary signal scaled by an external amplifier. The signal regulator receives the primary signal. Processing circuitry monitors an unscaled level of the primary signal. The primary signal is then output to the external amplifier for scaling, either by amplification or attenuation. The primary signal with a scaled level is in turn received by the signal regulator from the amplifier. The processing circuitry monitors the scaled level of the primary signal from the amplifier, and then generates a gain factor based upon the unscaled level and the scaled level of the primary signal. An auxiliary signal is received by the signal regulator. Adjusting circuitry receives the gain factor from the processing circuitry and adjusts a level of the auxiliary signal based upon the gain factor. The auxiliary signal with the adjusted level is then provided to an external component, for example, a loudspeaker or an amplifier. The signal regulator is particularly useful in regulating the volume of auxiliary audio channels in a surround-sound system based upon the volume of the main or front channels amplified by an audio/video receiver.

Another aspect of the signal regulator relates to the adjustment of a plurality of auxiliary signals. For example, the signal regulator may receive a source signal which the processing circuitry may decode into at least one primary signal indicative of front left and right channels and a plurality auxiliary signals indicative of surround-sound channels. Accordingly, the front channels may be provided to a receiver which adjusts the level (i.e., the volume) of the front channels. The front channels with the adjusted volume level may then be monitored by the processing circuitry in generating the gain factor. The signal regulator then adjusts the volume level of the surround-sound signals in response to changes in the volume of the front channels. Accordingly, the volume level of the surround-sound channels is always commensurate with the volume level of the front channels, regardless of external volume adjustment effected by the receiver. The gain factor may be calculated to be a difference between the gain the volume level of the front channels prior to being adjusted by the receiver and after being adjusted by the receiving. For example, if this difference is about 10 decibels (dB), then the adjusting circuitry may increase the volume level of the surround-sound signals by about 10 dB.

According to one aspect of the methodology of the present invention, a method regulates the level of an auxiliary signal in response to a change in the level of a primary signal effected by an amplifier. According to the methodology, after receiving the primary signal, the level thereof is monitored and defined as an unscaled level. The primary signal is then provided to the amplifier which scales the level either by amplification or attenuation. Upon receiving the primary signal from the amplifier, the scaled level of the primary signal is monitored. A gain factor is generated based on the unscaled level and the scaled level of the primary signal. A level of the auxiliary signal is then adjusted based upon the generated gain factor.

According to another aspect of the method of the invention, it is determined whether the primary signal changes phase by the amplifier. If it is determined that the primary signal did change phase, then the phase of the auxiliary signal is regulated accordingly. Upon determining phase changes, a delay, which may be defined as the time it takes for the primary signal to be scaled by the amplifier, may be calculated. This may be accomplished by generating a test tone of known data and combining this test tone with the primary signal prior to providing the primary signal to the amplifier. The primary signal which is scaled and provided by the amplifier is then compared with the test tone. When matching data samples are found, delay may be calculated.

A further aspect of the methodology of the invention involves cross safe guarding against erroneous adjustment of the auxiliary signal. To do so, the present invention cross correlates the primary signal prior to scaling (i.e., an unscaled primary signal) with the primary signal after scaling by the amplifier (i.e., a feedback primary signal). It is determined whether a correlation between the unscaled primary signal and the feedback primary signal is greater than a predetermined threshold. If so, the number of times the correlation is consecutively greater than the threshold is counted. Responsive to this consecutive counting, the auxiliary signal is adjusted only when the correlation is consecutively greater than the threshold for a predetermined number of times. This consecutive counting eliminates the possibility of generating a gain factor based on a feedback primary signal which does not correspond to the unscaled signal and, accordingly, the possibility of erroneously adjusting the auxiliary signal.

Other aspects, features, and advantages of the present invention will become apparent to those persons having ordinary skill in the art to which the present invention pertains from the following description taken in conjunction with the accompanying drawings.

BRIEF DESCRIPTION OF THE DRAWINGS

FIG. 7 is a diagrammatic representation of a method used in determining delay in accordance with the methodology of the invention;

FIG. 8A and 8B illustrate how the processor determines the phase;

FIG. 9 illustrates the correlation between P and P';

DETAILED DESCRIPTION OF EXEMPLARY EMBODIMENTS

Figure 1:
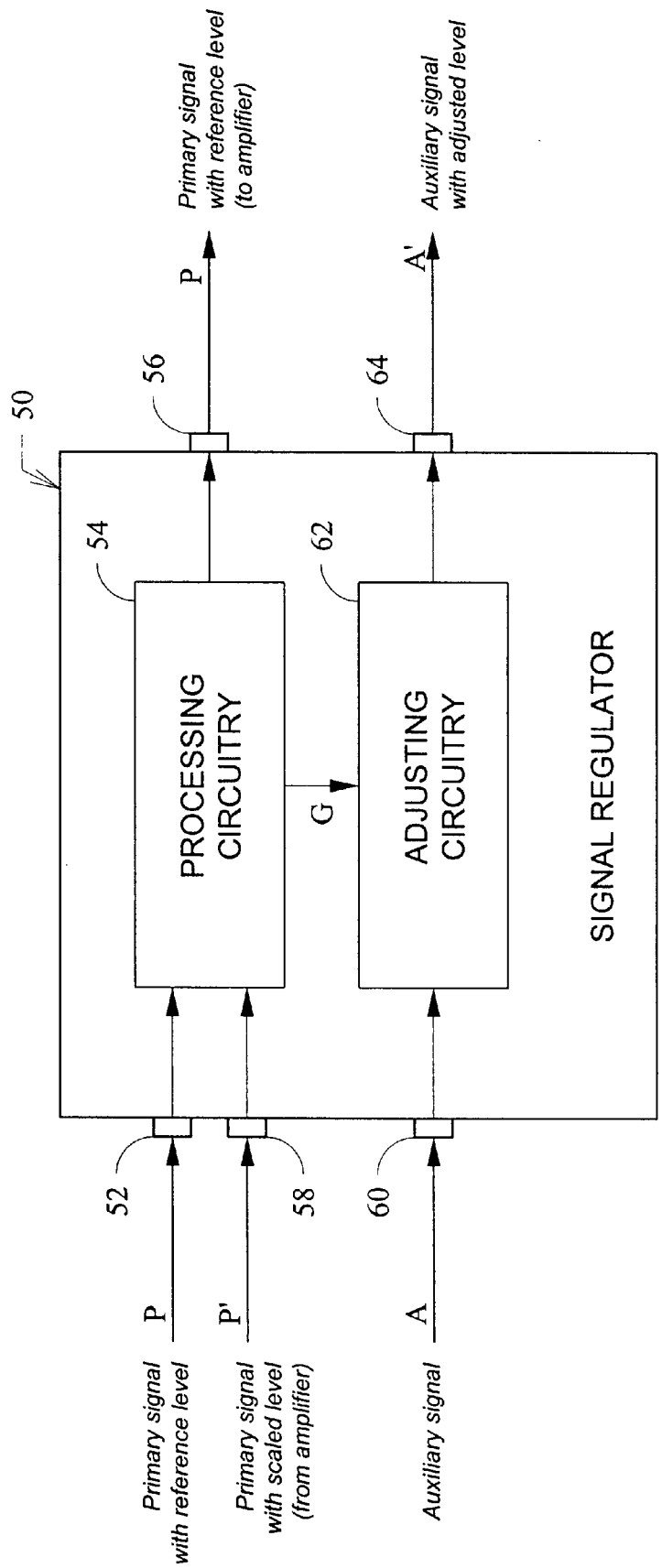
FIG. 1 is a block diagram of an exemplary embodiment of a signal regulator of the present invention.

Referring to the drawings in more detail, in FIG. 1 an exemplary embodiment of a signal regulator 50 of the present invention is illustrated. Exemplary signal regulator 50 regulates an auxiliary signal A based upon a primary signal P scaled by an amplifier (not shown in FIG. 1). Signal regulator 50 includes a primary signal input 52 which receives primary signal P from a transmission source. A level of primary signal P is defined as an unscaled level. For example, if primary signal P is an audio signal, then the unscaled level of the primary signal may be defined as an average energy level thereof.

Primary signal input 52 provides primary signal P to processing circuitry 54 of exemplary signal regulator 50. Exemplary processing circuitry 54 determines a level of primary signal P and defines an unscaled level therefrom. Primary signal P is then provided to a primary signal output 56. Primary signal output 56 is in communication with and provides primary signal P to an external amplifier. The external amplifier scales the level of primary signal P. As known in the art, amplifiers may scale a signal by either amplifying or attenuating the level thereof depending upon a gain of the amplifier. If amplified, the gain of the amplifier is greater than 1.0; if attenuated, the gain is less than 1.0. If the gain of the amplifier is approximately equal to 1.0, then the level of the signal remains substantially the same.

Signal regulator 50 includes a scaled primary signal input 58 in communication with the amplifier. Scaled primary signal input 58 receives from the amplifier the primary signal with a level scaled by the amplifier, which signal is indicated by reference alpha P'. Processing circuitry 54 receives primary signal P' and determines a level or magnitude of the scaled level. Exemplary processing circuitry 54 then calculates or generates a gain factor G based upon the unscaled level determined from primary signal P provided to the amplifier and the scaled level of primary signal P' received from the amplifier. Gain factor G is indicative of the scaling of the level of primary signal P effected by the external amplifier.

Signal regulator 50 includes an auxiliary signal input 60 which receives an auxiliary signal A. Adjusting circuitry 62 receives auxiliary signal A from auxiliary signal input 60 and gain factor G from processing circuitry 54. Exemplary adjusting circuitry 62 adjusts a level of auxiliary signal A based upon gain factor G and then provides auxiliary signal with an adjusted level to an auxiliary signal output 64, which signal is indicated by reference alpha A'.

One implementation of the principles associated with exemplary signal regulator 50 is in an audio system. For example, primary signal P may be an audio signal which provides an unscaled volume level. The external amplifier may then increase the volume of primary signal P and provide the scaled primary signal P' back to signal regulator 50. Gain factor G may then be calculated to be substantially equal to the increase in the volume of primary signal P. Adjusting circuitry 62 may then increase the volume level of auxiliary signal A by a magnitude substantially equal to the magnitude at which the amplifier increased primary signal P. For example, if the external amplifier increases the volume of primary signal P by 10 decibels (dB), then adjusting circuitry 62 may increase the volume of auxiliary signal A by about 10 dB. Accordingly, exemplary signal regulator 50 of the present invention regulates the level of an auxiliary signal responsive to an increase or a decrease in a level of a reference or primary signal.

Figure 2:
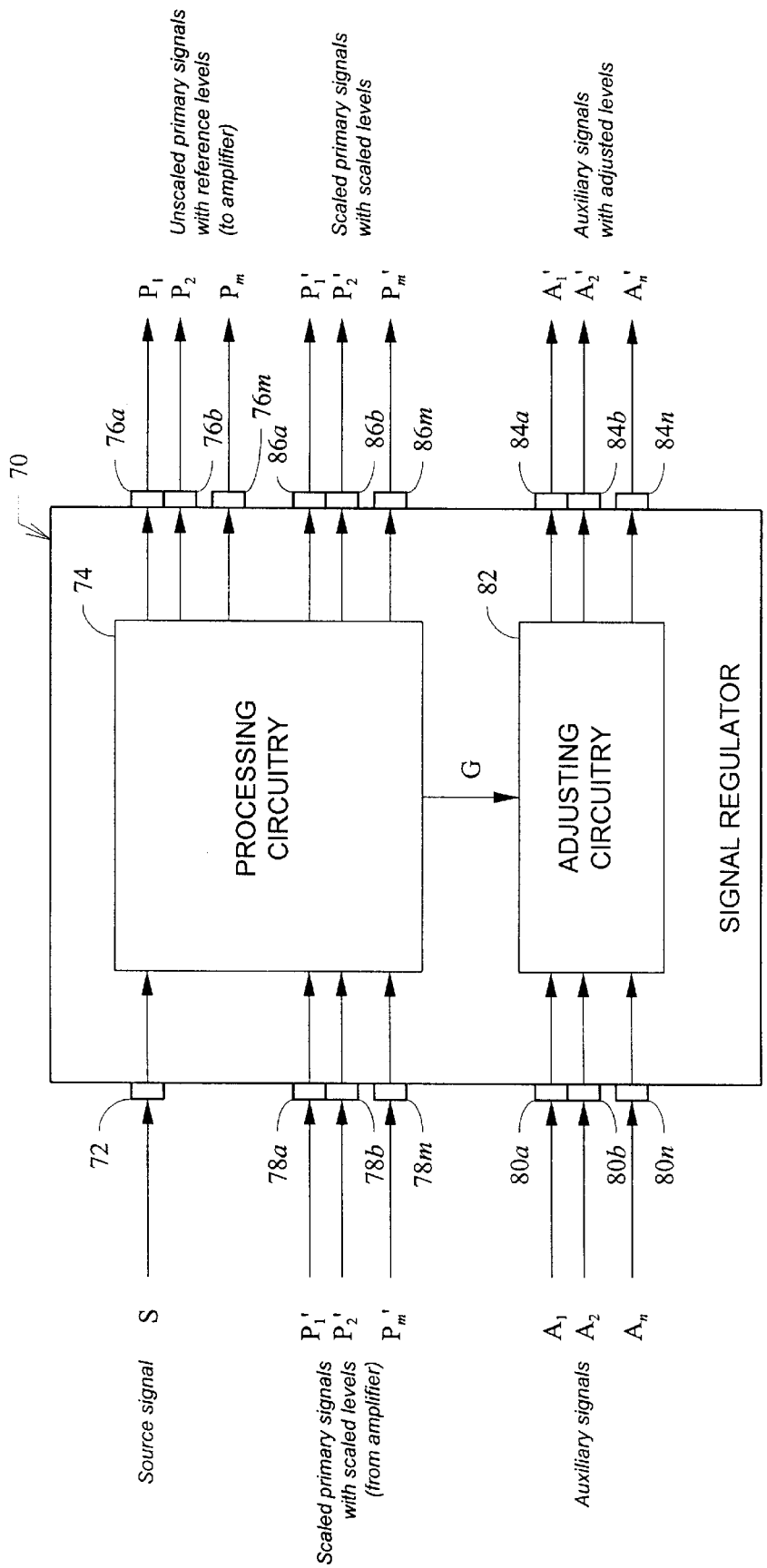
FIG. 2 is a block diagram of another exemplary embodiment of a signal regulator of the present invention, particularly illustrating plural signal inputs and outputs.

FIG. 2 illustrates another exemplary embodiment of a signal regulator 70 of the present invention. Exemplary signal regulator 70 operates analogously to signal regulator 50 described above, but rather than adjusting a single auxiliary signal based on a single primary signal, signal regulator 70 may adjust a plurality of auxiliary signals A based on scaled and unscaled levels of at least one primary signal P.

Signal regulator 70 includes a source signal input 72 which receives source signal S. Source signal S includes information which can be processed by processing circuitry 74. For example, source signal S may be a radio signal, a video signal, or a digital signal including both audio and video components. In addition, source signal S includes information for defining at least one primary signal P. Exemplary processing circuitry 74 may decode two or more primary signals $P_1, P_2, \ldots P_m$ from source signal S. Processing circuitry 74 monitors at least one of the primary signals P to determine an unscaled level thereof Exemplary signal regulator 70 includes a plurality of primary signal outputs 76a, 76b, ... 76m for providing the plurality of primary signals $P_1$–$P_m$ to an amplifier (not shown). The external amplifier scales the levels of the primary signals P. As mentioned above, the scaling of the primary signals P may be amplification or attenuation of the level of the signals depending upon the gain of the amplifier. For the purposes of this description, signals are indicated generally by an alpha and specifically with a subscripted numeral (e.g., primary signal $P_1$), and components are indicated generally with a numeral and specifically with an italicized alpha (e.g., primary output 76a); this numbering convention will be employed throughout this description.

Exemplary signal regulator 70 includes a plurality of scaled primary signal inputs 78a, 78b, ... 78m which receive from the amplifier the plurality primary signals $P_1'$, $P_2'$, ... $P_m'$ each with a level scaled by the amplifier. Exemplary processing circuitry 74 receives the scaled primary signals P' and determines the scaled level of the primary signal P' corresponding to the previously determined unscaled level. For example, if processing circuitry 74 determined the unscaled level of primary signal $P_2$, then processing circuitry 74 will determine the scaled level of adjusted primary signal $P_2'$. Gain factor G is then calculated by processing circuitry 74 based upon the unscaled and scaled levels of the monitored primary signal.

Exemplary signal regulator 70 includes a plurality of auxiliary signal inputs 80a, 80b, ... 80n which respectively receive a plurality of auxiliary signals $A_1, A_2, \ldots A_n$. Adjusting circuitry 82 adjusts the plurality of auxiliary signals A based upon the calculated gain factor G. The adjusted auxiliary signals A' are then provided to a plurality of auxiliary signal outputs 64. Exemplary signal regulator 70 may also include a plurality of scaled primary signal outputs 86a, 86b, ... 86m which respectively provide the plurality of scaled primary signals $P_1', P_2', \ldots P_m'$.

Figure 3:
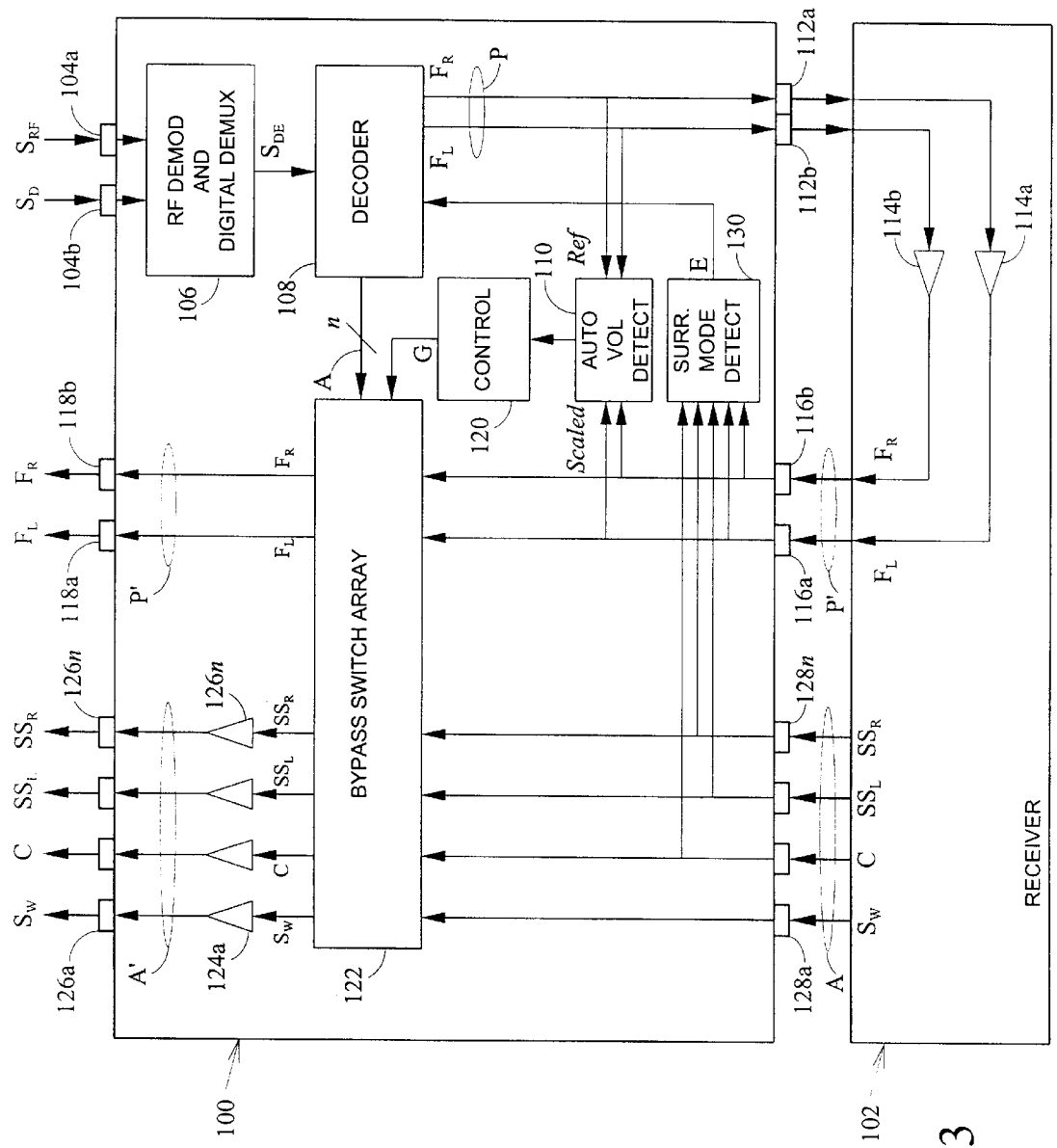
FIG. 3 is a schematic diagram of an exemplary of a volume-tracking system implemented in accordance with the signal regulation principles of the invention.

With reference to FIG. 3, the principles of signal regulation in accordance with the present invention are implemented as a volume-tracking system 100. Exemplary volume-tracking system 100 is shown in association with an audio/video receiver 102. Volume-tracking system 100 receives a source signal S at a source signal input 104. Source signal input 104a is illustrated as a radio frequency (RF) input for receiving RF source signals $S_{RF}$, and source signal input 104b is illustrated as a digital input for receiving digital source signals $S_D$. Digital source signals $S_D$ may be from a digital video disc (DVD) player or from a digital television (DTV) system. Exemplary volume-tracking system 100 may include circuitry for demodulating RF source signals $S_{RF}$ and demultiplexing digital signals $S_D$, which circuitry is indicated by reference numeral 106. Demodulating and demultiplexing circuitry 106 provides a demodulated/demultiplexed signal $S_{DE}$ to a decoder 108 which decodes signal $S_{DE}$ into a plurality of signals each representing a respective audio channel of the source signal S. For example, decoder 108 provides primary signals P which may include a front left signal $F_L$ and a front right signal $F_R$, and auxiliary signals A which may include a surround-sound left signal $SS_L$, a surround-sound right signal $SS_R$, a center signal C, and a sub-woofer signal SW.

The primary signals P from decoder 108 are provided to automatic volume detection circuitry 110 and to primary signal outputs 112a and 112b. Automatic volume detection circuitry 110 monitors an unscaled level of at least one of the primary signals P. The primary signal outputs 112a and 112b provide front left signal $F_L$ and front right signal $F_R$ to the receiver 102 which includes amplifiers 114a and 114b for scaling the front signals F either by amplification or by attenuation. The front signals F (indicated as scaled primary signals P') are then received by volume-tracking circuitry 100 at scaled primary inputs 116a and 116b, which are then output at scaled primary outputs 118a and 118b.

Automatic volume detection circuitry 110 monitors a level of at least one of the front signals F scaled by the receiver 102, and compares the scaled level with the previously monitored unscaled level. Control circuitry 120 computes a gain factor G based on the unscaled and scaled levels of the monitored front signal F. In an home-theater embodiment, gain factor G represents a surround-sound volume control signal which ensures that each of the auxiliary surround-sound outputs is at a level commensurate with the gain of the scaled primary signals P' provided by the receiver 102. Gain factor G is provided to a bypass switch array 122 which receives the auxiliary signals A from decoder 108 and which is coupled to a plurality of variable amplifiers 124a, 124b, . . . 124n. Based upon gain factor G, a level of each of the auxiliary signals A is adjusted by a respective amplifier 124. The adjusted auxiliary signals A' are then output by volume-tracking system 100 at adjusted auxiliary outputs 126a, 126b, . . . 126n.

In the exemplary embodiment of volume-tracking system 100 described above, the auxiliary signals A are provided by decoder 108 as respective channels of the source signal S. In an alternative embodiment, auxiliary signals A may be input at a plurality of auxiliary inputs 128a, 128b, . . . 128n. In this case, the auxiliary signals A may be provided by the receiver 102 as respective signals for surround sound channels. Exemplary volume-tracking system 100 may then also include surround-sound mode detection circuitry 130 which monitors the auxiliary surround-sound signals A provided by the receiver 102. Circuitry 130 provides an enable/disable signal E to decoder 108 depending upon whether a surround-sound mode is detected at the receiver 102. For example, if circuitry 130 detects a surround-sound mode from auxiliary signals A provided by the receiver 102, then signal E is a disable signal which disables decoder 108 so that auxiliary signals A are not provided by decoder 108 to bypass switch array 122. In this case, auxiliary signals A essentially pass through volume-tracking system 100 without any amplification or attenuation by amplifiers 124. Alternatively, if circuitry 130 does not detect a surround-sound mode from the receiver 102, then signal E is an enable signal which enables decoder 108 to provide auxiliary signals A to bypass switch array 122 to be amplified or attenuated. In general, bypass switch array 122 and the associated variable amplifiers 124 ensure that the levels of the auxiliary signals A output by the system 100 are commensurate with the scale or magnitude that the amplifier 102 amplified or attenuated the level of the primary signal(s) P.

Figure 4:
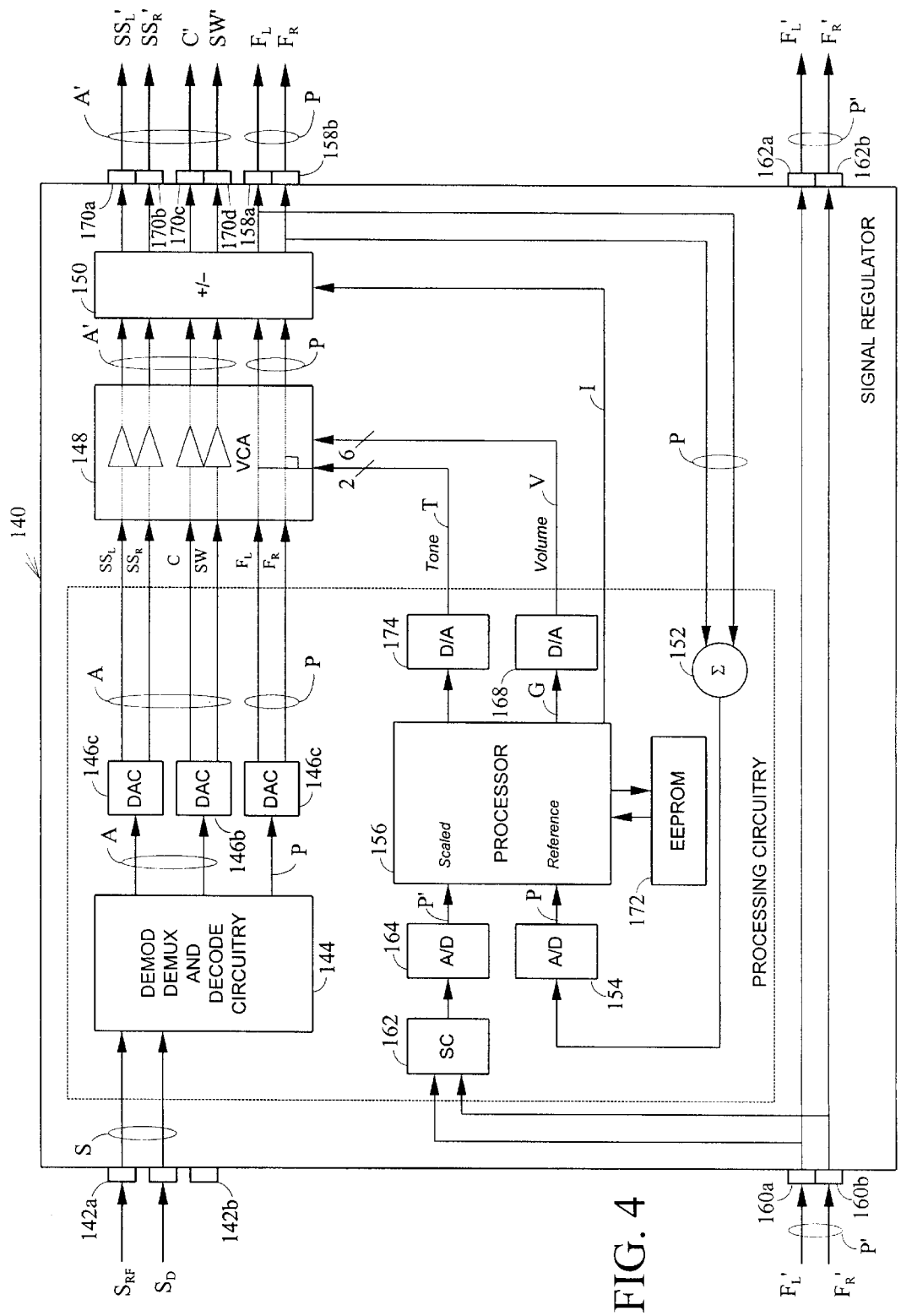
FIG. 4 is a schematic diagram of a signal regulator for regulating volume of surround-sound channels of an audio/video system.

With reference to FIG. 4, a detailed exemplary embodiment of a volume-tracking system 140 of the present invention is illustrated. Volume-tracking system 140 is particularly configured for a home theater environment for regulating the volume of multiple surround-sound channels. A source signal S, for example an RF signal $S_{RF}$ or a digital signal $S_D$, received at an input 142 is demodulated or demultiplexed by a circuitry 144. Circuitry 144 then decodes the source signal S into at least one primary signal P and at least one auxiliary signal A which are fed to respective digital-to-analog (D/A) converters 146. The outputs of the D/A converters 146 represent the respective channels of the source signal S. In the illustrated embodiment, the primary signals P represent main or front channel audio signals $F_L$ and $F_R$, and the auxiliary signals A represent rear channel or surround-sound audio signals $SS_L$ and $SS_R$, a center channel audio signal C, and a sub-woofer audio signal SW. A voltage-controlled amplifier (VCA) 148 receives the primary and auxiliary signals P and A, and provides outputs to an inverter 150.

As illustrated, the primary signals P are fed through VCA 148 without amplification or attenuation. The primary signals P may then be fed to a summation circuit 152, the output of which is tied to an analog-to-digital (A/D) converter 154. A/D converter 154 provides processor 156 with primary signal P. Processor 156 calculates a level of the primary signal P to be used as reference. A reference feedback circuit is defined by the primary signals P being fed through summation circuitry 152 and A/D converter 156.

In addition to the reference feedback circuit, the primary signals P are provided via primary signal outputs 158 to an external component with an amplifier, for example, an audio/video receiver as shown in FIG. 3. The external amplifier amplifies or attenuates the primary signals, which are returned to volume-tracking system 100 as scaled primary signals P' at scaled primary signal inputs 160. The scaled primary signals P' may then be provided to signal conditioning circuitry 162 and an A/D converter 164. Signal conditioning circuitry 162 may filter the scaled primary signals P' and may dynamically scale the signals P' to a level within the range of the A/D converter 164. A filter may also be positioned between summation circuit 152 and A/D converter 154 for performing similar functions. An output of A/D converter 164 provides the scaled primary signal P' to processor 156, which calculates a level of the scaled primary signal P'. Processor 156 compares the unscaled level determined from primary signal P with the scaled level of scaled primary signal P' to determine the magnitude at which the external amplifier scaled the primary signal P.

Figure 5:
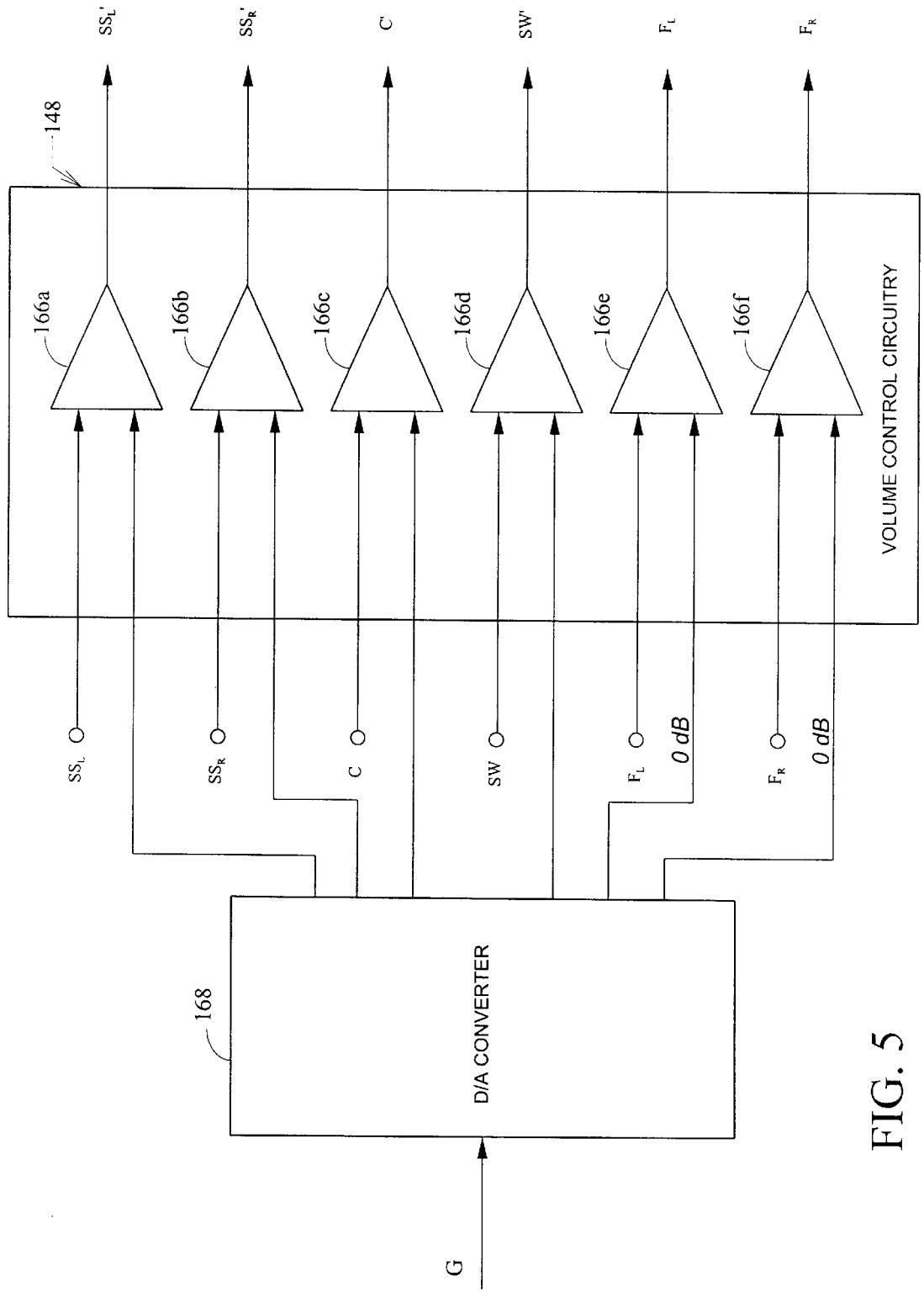
FIG. 5 is a schematic diagram of volume control circuitry for signal regulator illustrated in FIG. 4.

A level of each of the auxiliary signals A is then either amplified or attenuated by VCA 148 in response to gain factor G. With additional reference to FIG. 5, exemplary VCA 148 is illustrated in detail to include a plurality of amplifiers 166a, 166b, . . . 166f. Each of the amplifiers 166 receives a respective auxiliary signal A or primary signal P. Each of the amplifiers 166 also has a input from D/A converter 168 indicative of gain factor G calculated by processor 156. D/A converter 168 converts gain factor G to a volume signal V (see FIG. 4) useable by amplifiers 166. As shown in the drawing, primary signals P, as indicated as front left signal $F_L$ and front right signal $F_R$, are neither amplified nor attenuated. Rather, amplifier 166e and amplifier 166f respectively receiving the primary signals P (i.e., front signals $F_L$ and $F_R$) receive a signal from D/A converter 168 corresponding to 0 dB. Accordingly, the primary signals P are essentially passed through without adjustment by VCA 148.

The adjusted auxiliary signals A' output by VCA 148 may then be inverted by inverter 150 prior to being provided to auxiliary signal outputs 170. The scaled primary signals P' received at inputs 160 are provided to scaled primary signal outputs 162. The level of each adjusted auxiliary signal A' at outputs 170 is at a level commensurate with the scaled level of the scaled primary signals P' at outputs 162. The auxiliary signals outputs 170 and the scaled primary signal outputs 162 may then be connected to, for example, loudspeakers or external amplifiers.

Volume-tracking system 140 may include an electrically erasable/programmable read-only memory (EEPROM) 172 connected to processor 156. EEPROM 172 stores information used by the system. For example, scale, volume, delay, and phase settings (which will be discussed below) may be updated and stored in EEPROM 172 by processor 156. In addition, volume-tracking system 140 may include an additional D/A converter 174 connected to processor 156. D/A converter 174 provides a test tone signal T generated by processor 156 to VCA 148 to be combined with the primary signals P (which will also be discussed below).

Figure 6:
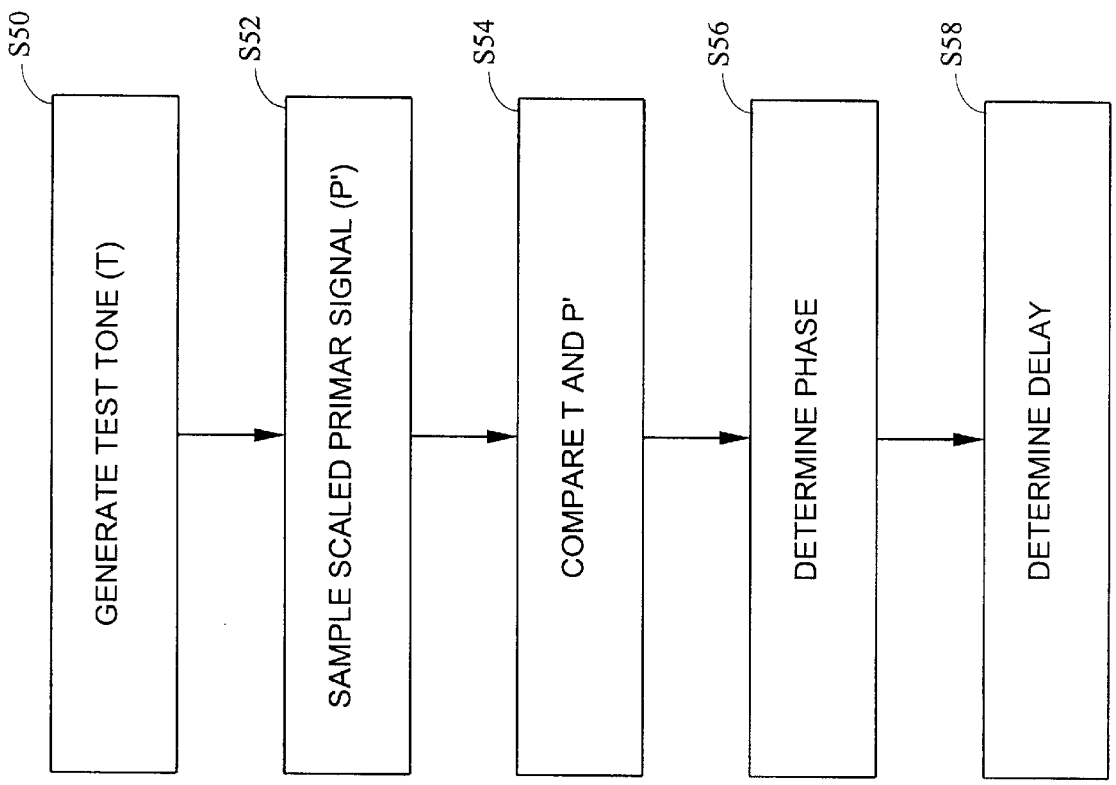
FIG. 6 is a flow chart illustrating steps of an exemplary method for calculating phase and delay in a volume-tracking system of the present invention.

With further reference to FIGS. 3 and 4 and additional reference to FIG. 6, the setup and operation of volume-tracking system 140 will now be described in more detail. During set up, delay and phase changes are determined. The delay of the system and the phase of the receiver 102 is measured by processor 156 firstly generating test tone T through D/A converter 174 (as indicated by step S50 in FIG. 6). Test tone T is provided to each of the unscaled primary signals P which are in turn provided to the external receiver 102. The primary signals P' scaled by the receiver 102 are then sampled by processor 156 (step S52). The time required for test tone T to travel from processor 156 to the receiver 102 and back to processor 156 substantially defines the delay of the system. To determine the delay, test tone T and the scaled primary signals P' are compared by processor 156 (step S54). Based on this comparison, phase may be calculated (step S56), as well as delay (step S58). Processor 156 may control the operation of phase inverter 150 with phase control signal I to ensure synchronization of the phases between each of the auxiliary and primary signals A and P.

An exemplary method of the present invention for determining phase and delay is by means of a "moving ladder" comparison. FIG. 7 illustrates schematically such a comparison. Test tone T is a repeated signal with a fixed data segment or sample block which is designed to have minimum spectral distortion when repeating. Test tone T, which is received via the reference or unscaled primary signals P, is compared with the scaled primary signals P' which are fed back to processor 156. Test tone T is compared sample by sample with the scaled primary signal P' until a corresponding or matching sample block is located. The corresponding or matched sample block of test tone T and the scaled primary signal P' is represented by the diagonal arrows in FIG. 7. The feedback samples or data received prior to the matching samples represents the delay ($\Delta t$) of the system. The delay $\Delta t$ determined at this point is a course delay, and based upon this course determination, processor 156 will calculate the delay more precisely, which will be discussed in more detail below.

With additional reference to FIGS. 8A and 8B, processor 156 determines phase by determining whether primary signal(s) P' is negative or positive upon returning from the receiver 102. This phase determination is preferably carried out prior to determining delay. As shown in FIGS. 8A and 8B, test tone T is illustrated as a positive signal initially. If scaled primary signal P' also positive initially, as shown in FIG. 8A, then phase is not inverted by the receiver 102. Alternatively, if scaled primary signal P' is negative initially, as shown in FIG. 8B, then phase is inverted by the receiver 102. Upon determining the phase of the receiver 102, processor 156 stores the phase information in EEPROM 172 and generates phase control signal I accordingly to control the phase of adjusted auxiliary signals A' at inverter 150.

To precisely measure delay, after roughly determining delay by the moving ladder comparison described above, processor 156 performs cross correlation on the reference or unscaled primary signal P and the feedback primary signal P'. With additional reference to FIG. 9, processing circuitry 156 determines when the correlation of the two primary signals P and P' is at a maximum. At that point, cross correlation is maximized, and the delay $\Delta t$ can be precisely determined.

Cross correlation, which is represented by $C_{xy}(k)$, may be calculated as follows:

$$C_{xy}(k) = (\sigma_x^2 \sigma_y^2 N)^{-1} \sum x(n)y(n+k) \quad \text{where: } k = \text{delay}$$

$$x(n) = \text{reference signal } P$$

$$y(n+k) = \text{feedback signal } P'$$

$$\sigma_x^2 = N^{-1} \sum [x(n) - M_x]^2 \quad \text{where: } M_x = N^{-1} \sum x(n)$$

$$\sigma_y^2 = N^{-1} \sum [y(n+k) - M_y]^2 \quad \text{where: } M_y = N^{-1} \sum y(n+k)$$

Cross correlation $C_{xy}(k)$ ranges from −1 to +1. The signals P and P' are more correlated as $C_{xy}(k)$ moves toward +1 and are less correlated as $C_{xy}(k)$ moves toward −1. All summations represented herein by $\Sigma$ are from n=0 to N−1.

In calculating cross correction, the following definitions are made:

A=$\Sigma x(n)y(n+k)$

B=$\Sigma [x(n)-M_x]^2$

C=$\Sigma [y(n+k)-M_y]^2$

Then cross correlation $C_{xy}(k)$ is defined as:

$C_{xy}(k)=A^2/BC$

In view of this equation, the cross correlation $C_{xy}(k)$ is positive when A is positive and is negative when A is negative.

Figure 10:
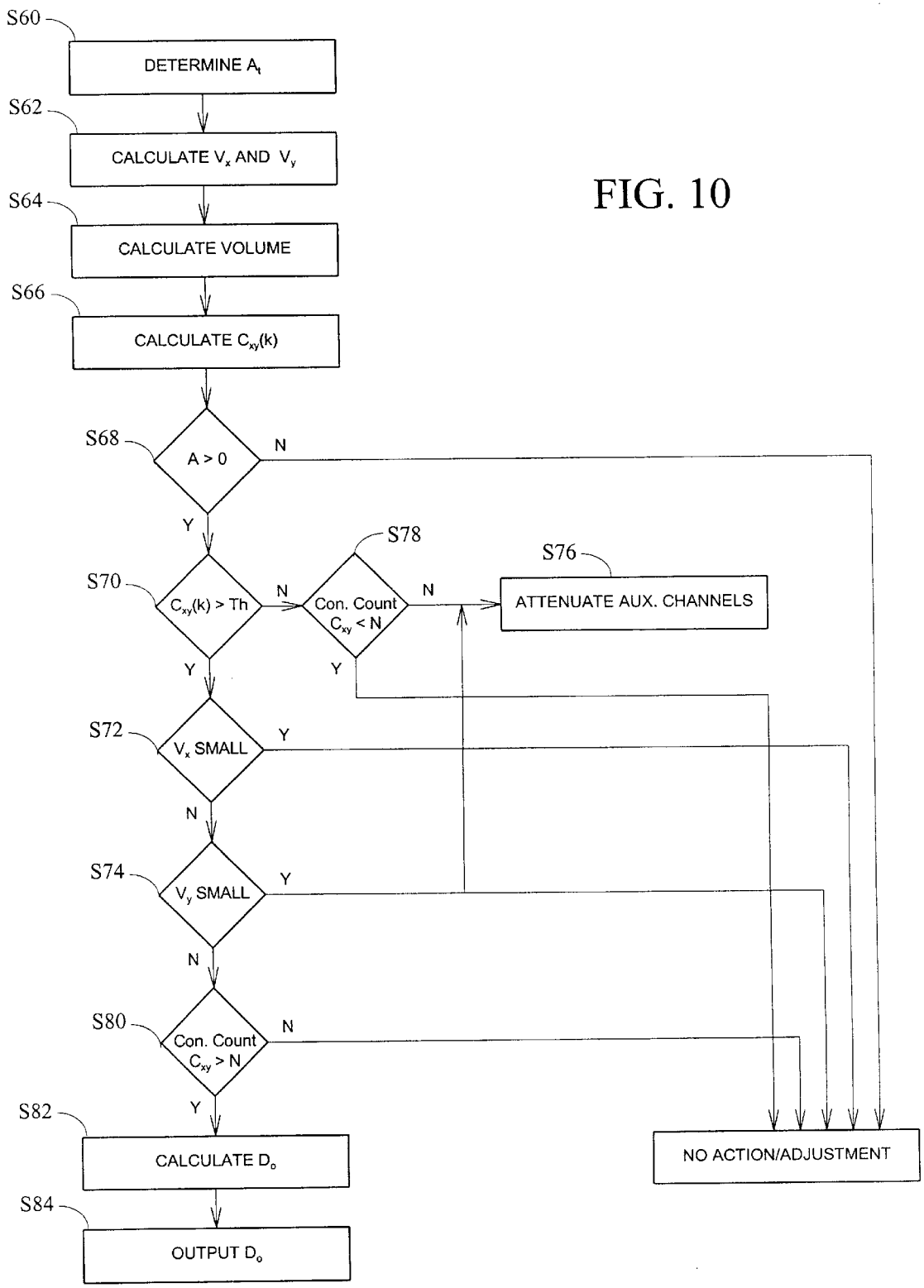
FIG. 10 is a flow chart illustrating steps of an exemplary method for cross correlating an unscaled signal and a feedback signal in accordance with the present invention.

Referencing FIG. 10, an exemplary method for cross correlating the reference signal P and the feedback signal P' is illustrated. In conjunction with the exemplary method, the following variables are used:

x=data from reference signal P (i.e., decoded primary signal)

y=data from feedback signal P' (i.e., scaled primary signal)

$R_f$=signal regulator no gain/no loss reference $A_r$=dynamic scaling factor s=volume adjustment device (i.e., VCA) accuracy (dB/bit)

In view of these definitions, dynamic scaling factor $A_r$ may firstly be determined (step S60) at signal conditioning circuitry 162. If the scaled primary signals P' are at a level too great for A/D converter 164, then the scaling factor $A_r$ will attenuate signals P'. The volume setting (in bits) may be calculated as follows after determining $V_y$ and $V_x$ (steps S62 and S64):

$$V = 20\log[(V_x/V_x) \cdot R_f \cdot A_t] \cdot 1/s \quad \text{where: } V_y = \sum |y(n+k)|$$
$$V_x = \sum |x(n)|$$
$$V = (20/s)(\log V_y - \log V_x + \log R_f + \log A_t)$$

$V_y$ represents the energy of the sample block of data of the feedback primary signal P', and $V_x$ represents the energy of the corresponding sample block of data of the decoded primary signal P. After calculating volume, cross correlation $C_{xy}(k)$ as outlined above may be calculated (step S66).

Based upon the calculation of cross correlation $C_{xy}(k)$, processor 156 performs a number of calculations to safe guard volume-tracking system 140 from erroneously adjusting the level of the auxiliary signals A. More specifically, processor 156 ensures that the auxiliary signals A are adjusted only when the reference primary signal P and the scaled primary signals P' are correlated. Correlated primary signals P and P' indicates that the scaled primary signals P' received at inputs 160 are the same signals as those provided at outputs 158 and not some other signal output by the receiver 102 (such as a built-in tuner signal). If the primary signals P and P' are not correlated, then the level of the auxiliary signals A is not adjusted. Accordingly, volume-tracking system 140 will not adjust the level of the auxiliary signals A based on a scaled primary signal P' which does not correspond to the reference primary signals P associated with auxiliary signals A.

To carry out this safe-guard procedure, the summation value of the product of the data of the reference and the feedback primary signals P and P' is determined, which value was defined as A above to equal $\Sigma x(n)y(n+k)$. If A is a negative number (step S68), then this indicates that the primary signals are not correlated and no action is taken. If A is a positive number, then processor 156 determines whether the cross correlation $C_{xy}(k)$ is greater than a predetermined threshold Th For example, as cross correlation $C_{xy}(k)$ may range from −1 to +1, the threshold Th may be chosen to be about 0.75 or 0.8. Accordingly, if cross correlation $C_{xy}(k)$ is greater than the predetermined threshold Th (step S70), then processor 156 determines whether the value of $V_x$ (as defined above) is a small number (step S72). If so, no action is taken. If $V_x$ is a substantial number, then processor 156 determines whether the value of $V_y$ (as defined above) is a small number (step S74). If so, no action is taken; alternatively, processor 156 may attenuate the auxiliary signals A (step S76). If the cross correlation $C_{xy}(k)$ is not greater than the predetermined threshold Th (at step S70), then processor 156 counts the consecutive number of time the cross correlation $C_{xy}(k)$ is less than the threshold Th. If the consecutive counts is below a predetermined number N (step S78), then no action is taken. It the consecutive counts is above the predetermined number N, then processor 156 may attenuate the auxiliary channels (at step S76).

If neither $V_x$ nor $V_y$ is a small number, then this indicates strong reference and feedback signals P and P', and processor 156 determines counts the number of time the cross correlation $C_{xy}(k)$ satisfies the foregoing conditions. If the reference and feedback signals P and P' correlated over a predetermined number N of consecutive samples (step S30), then processor 156 outputs the volume signal to adjust the level of the auxiliary signals A. If the cross correlation $C_{xy}(k)$ is not achieved over a predetermined number N (for example, 8 or 10 samples) consecutively, then no action is taken by the system. In outputting the volume signal V to VCA 148, processor 156 may also calculate a smoothing filter $D_o$ (step S82) for the volume signal V calculated above and output the filtered volume signal V to VCA 148 (step S84). The smoothing filter $D_o$ may be calculated as follows:

$$D_o = \alpha D_o' + (1-\alpha) \cdot V \text{ where: } D_o' = \text{previous } D_o$$

Figure 11:
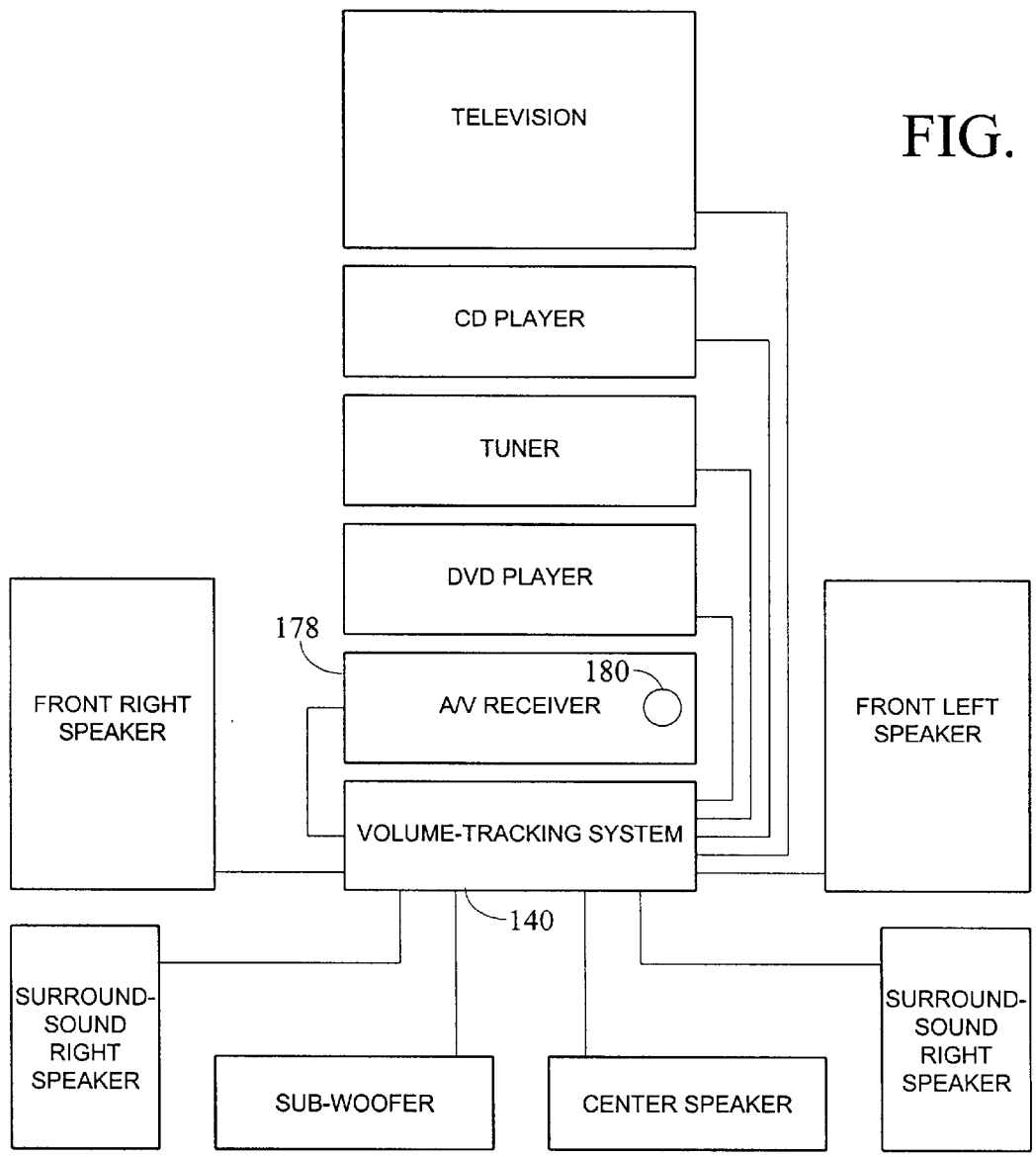
FIG. 11 is a block diagram of a home-theater system with an automatic volume-tracking system implemented in accordance with the present invention.

FIG. 11 illustrates a preferred implementation of volume-tracking system 140 of the present invention in a home-entertainment system. Volume-tracking system 140 is shown receiving source signal inputs from electronic components such as a television, a CD player, a tuner, a DVD player, and an A/V receiver 178 with a volume control 180, and providing audio outputs to front left and right speakers, surround-sound left and right speakers, a center speaker, and a sub-woofer. With further reference to FIG. 4, if a user is listening to a radio station through the tuner, then the signal from the tuner is provided to volume-tracking system 140 as source signal S at one of the source signal inputs 142. The tuner source signal is only a two-channel stereo signal and does not include any auxiliary or surround-sound signals. Accordingly, the tuner source signal is decoded as primary signals P, which are only amplified by the A/V receiver 178 and not volume-tracking system 140. In this case, volume-tracking system 140 functions essentially as a black box, passing the primary signal P onto the primary signal outputs 158 without adjustment my VCA 148.

If the user switches from the tuner to, for example, the DVD player, then the source signal S will be a multiple-channel digital surround-sound signal. Accordingly, circuitry 144 will decode the digital signal SD into the auxiliary signals A and the primary signals P. In accordance with the foregoing description, the levels of the auxiliary signals A' provided to the surround-sound speakers will be at a level commensurate with the primary signals P' provided to the front speakers. If the user increases or decreases volume of the DVD signal with the volume control 180 of the receiver, then volume-tracking system 140 automatically adjusts the volume of auxiliary signals A provided to the surround-sound speakers. Accordingly, the level of the output auxiliary signals A' are always commensurate with the level of the output primary signals P.

In view of the foregoing description, processor 156 may include firmware for controlling the functions of volume-tracking system 140. The firmware may be implemented in accordance with the following exemplary source code. The source code is written for an 8051 microprocessor, which is known in the art.

Those skilled in the art will understand that the embodiments of the present invention described above exemplify the present invention and do not limit the scope of the invention to these specifically illustrated and described embodiments. The scope of the invention is determined by the terms of the appended claims and their legal equivalents, rather than by the described examples. In addition, the exemplary embodiments provide a foundation from which numerous alternatives and modifications may be made, which alternatives and modifications are also within the scope of the present invention as defined in the appended claims.

```
        $TITLE   FIRMWARE FOR VOLUME SYNCHRONIZATION

NAME     VOLSYNC
        ;
        ;*******************************************************************
        ;        DEFINE CONSTANTS                                           *
        ;*******************************************************************
        BEGIN    EQU      60H          ;BEGIN TO FILL BUFFER FLAG
                                       ;BEGIN = 0 1ST GROUP OF DATA FILLED IN BUF
                                       ;BEGIN = 1 1ST GROUP OF DATA NOT FILLED IN BUF
        DLYFL    EQU      61H          ;DLYFL FLAG
                                       ;DLYFL = 0 THERE IS NO DELAY
                                       ;DLYFL = 1 DELAY IS AVAILABLE
        WDPASS   EQU      62H          ;WATCH-DOG PASS 1 SECOND FLAG.
                                       ;WDPASS = 0   WD NOT PASS 1 SECOND.
                                       ;WDPASS = 1   WD PASS 1 SECOND.
        FINSH    EQU      63H          ;TEST SIGNAL PROCESSING FLAG
                                       ;FINSH=0 SIGNAL TEST IN PROCESS
                                       ;FINSH=1 TEST FINISHED
```

```
        PHASE   EQU     64H     ;TEST SIGNAL PROCESSING FLAG
                                ;FINSH=0 SIGNAL TEST IN PROCESS
                                ;FINSH=1 TEST FINISHED
        NOSIG   EQU     65H     ;SIGNAL PROCESSING FLAG
                                ;NOSIG = 0 TEST TONE DETECTED, CONTINUE PROCESS
                                ;NOSIG = 1 TEST TONE NOT DETECTED, STOP PROCESS
        INVOL   EQU     66H     ;INITIATION FLAG
                                ;INVOL = 0 INITIATION PROCESS FINISHED
                                ;INVOL = 1 INITIATION PROCESS NOT FINISHED
        ATTPC   EQU     67H     ;ATTENUATION PROCESS FLAG
                                ;ATTPC = 0 ATTENUATION IS NOT IN PROCESS
                                ;ATTPC = 1 ATTENUATION IS IN PROCESS
        MUTCL   EQU     68H     ;SIGNAL MUTE FLAG
                                ;MUTCL = 0 SIGNAL IS UNMUTED
                                ;MUTCL = 1 SIGNAL IS MUTED
        TREND   EQU     69H     ;TREND VERIFICATION FLAG
                                ;TREND = 0 AD1,AD2 INPUT IS FITTED
                                ;TREND = 1 AD1,AD2 INPUT IS UNFITTED
        TRNVF   EQU     6AH     ;
        BASIG   EQU     6BH     ;INPUT SIGNAL FLAG
                                ;BASIG = 1 SIGNAL IS OUT OF RANGE
                                ;BASIG = 1 SIGNAL IS OK

CIRCL   EQU     6CH
        TMBT1   EQU     70H     ;TEMPORARY FLAG
        TMBT2   EQU     71H     ;TEMPORARY FLAG
        TMBT3   EQU     72H     ;TEMPORARY FLAG
        TMBT4   EQU     73H     ;TEMPORARY FLAG
        MS50    EQU     74H     ;100MS FLAG
        AT1     EQU     75H     ;1=ATTENUATION 1 FLAG SET
                                ;0=ATTENUATION 1 FLAG NOTSET
        AT2     EQU     76H     ;1=ATTENUATION 2 FLAG SET
                                ;0=ATTENUATION 2 FLAG NOT SET
        AT3     EQU     77H     ;1=ATTENUATION 3 FLAG SET
                                ;0=ATTENUATION 3 FLAG NOTSET
        AT4     EQU     78H     ;1=ATTENUATION 4 FLAG SET
                                ;0=ATTENUATION 4 FLAG NOT SET

MUTSR   EQU     79H
        MUTSL   EQU     7AH
        MUTCT   EQU     7BH
        MUTSB   EQU     7CH
        KYBRD   EQU     7DH

WDARM   BIT     P1.0    ;WATCH-DOG ARM
        AA17    BIT     P3.5    ;EXTENDED ADD AA17
        ;+
        ;       DEFINE INTERNAL DATA MEMORY ADDRESS
        ;-
        HALF    EQU     31H     ;HALF SECOND (500MS) COUNTER REGISTER
        SECOND  EQU     32H     ;1 SECOND COUNTER  REGISTER
        VOLSR   EQU     33H
        VOLSL   EQU     34H
        VOLC    EQU     35H
        VOLSB   EQU     36H
        ATTY1   EQU     37H
        ATTY2   EQU     38H
        ATTY3   EQU     39H
        DLYT    EQU     3AH     ;DELAY TIME
        ADB1    EQU     3BH
        ADB2    EQU     3CH
        PKSN    EQU     47H     ;PEAK DATA SIGN(+=1,-=0)
```

-17-

```
PKTR    EQU     48H             ;PEAK DATA TREND(INCR=1,DECR=0)
ACRC    EQU     49H             ;ACCUMULATOR FOR ROUTINE CIRCLE
RT1     EQU     4AH             ;TEMPORARY REGISTER
RT2     EQU     4BH             ;TEMPORARY REGISTER
ABY1    EQU     4CH             ;ABS SUMMARY OF Y FOR 16 SAMPLE(HIGH BYTE)
ABY2    EQU     4DH             ;ABS SUMMARY OF Y FOR 16 SAMPLE(LOW BYTE)
ABX1    EQU     4EH             ;ABS SUMMARY OF X FOR 16 SAMPLE(HIGH BYTE)
ABX2    EQU     4FH             ;ABS SUMMARY OF X FOR 16 SAMPLE(LOW BYTE)
RG0     EQU     50H             ;TEMPORARY REGISTER
RG1     EQU     51H             ;TEMPORARY REGISTER
RG2     EQU     52H             ;TEMPORARY REGISTER
RG3     EQU     53H             ;TEMPORARY REGISTER
RG4     EQU     54H             ;TEMPORARY REGISTER
RG5     EQU     55H             ;TEMPORARY REGISTER
RG6     EQU     56H             ;TEMPORARY REGISTER
RG7     EQU     57H             ;TEMPORARY REGISTER
MENY    EQU     58H             ;THE AVERAGE OF X FOR 16 SAMPLE
MENX    EQU     59H             ;THE AVERAGE OF Y FOR 16 SAMPLE
LST1    EQU     5AH             ;HIGH BYTE OF LAST TIME OUTPUT
LST2    EQU     5BH             ;LOW BYTE OF LAST TIME OUTPUT
LEY1    EQU     5CH             ;LAST TIME OUTPUT OF Y FILTER (HIGH BYTE)
LEY2    EQU     5DH             ;LAST TIME OUTPUT OF Y FILTER (LOW BYTE)
LEX1    EQU     5EH             ;LAST TIME OUTPUT OF X FILTER (HIGH BYTE)
LEX2    EQU     5FH             ;LAST TIME OUTPUT OF X FILTER (LOW BYTE)
;+
;       DEFINE REGISTER ADDRESS
;-
R0ADD   EQU     000H            ;R0 ADDRESS
R1ADD   EQU     001H            ;R1 ADDRESS
R2ADD   EQU     002H            ;R2 ADDRESS
R3ADD   EQU     003H            ;R3 ADDRESS
R4ADD   EQU     004H            ;R4 ADDRESS
R5ADD   EQU     005H            ;R5 ADDRESS
R6ADD   EQU     006H            ;R6 ADDRESS
R7ADD   EQU     007H            ;R7 ADDRESS
PCON    EQU     087H            ;POWER CONTROL REGISTER ADDRESS
;+
;       DEFINE VARIABLES
;-
TMODS   EQU     021H            ;TIMER 0 IS MODE 2, TIMER 1 IS MODE 1
TCONS   EQU     055H            ;ENABLE TIMER 0 & 1 RUN CONTROL BIT
                                ;INTERRUPT 0 & 1 ARE EDGE TRIGGERED
TCONS1  EQU     015H            ;TURN TIMER 1 OFF FOR ATTEN CHECK
SCONS   EQU     0D0H            ;SERIAL PORT MODE 3, EN SERIAL RECEP
IES     EQU     08BH            ;DISABLE SERIAL PORT INT,
                                ;EN TIMER 0 INT, EN TIMER 1 INT
                                ;EN INT 0,EN INT 1
IES1    EQU     002H            ;DISABLE INTERUPTS, EXC WDT
EN_AD1  EQU     010H            ;ENABLE AD1, EN AD1 & 2 DURRING WRITE
EN_AD2  EQU     020H            ;ENABLE AD2
EE_CS   EQU     030H            ;ENABLE EEPROM CHIP SELECT
DAC_WR  EQU     040H            ;CLOCK IN VOLUME
FRQ     EQU     050H            ;WRITE TO FREQ BUFFER
LED1    EQU     010H            ;WRITE TO 1ST 8 LEDS AA17=1
LED2    EQU     020H            ;WRITE TO 2ND 8 LEDS AA17=1
LED3    EQU     030H            ;WRITE TO 3RD 8 LEDS AA17=1
MUT_CL  EQU     0F0H
;+
;       DEFINE INTERRUPT VECTORS

ORG     0000H
        LJMP    INIT            ;POWER ON RESET, INITIALIZATION
```

```
                ORG     0003H
                LJMP    I0SVC           ;EXTERNAL INTERRUPT 0

ORG     000BH
                LJMP    T0SVC           ;TIMER 0 OVERFLOW INTERRUPT

ORG     001BH
                LJMP    T1SVC           ;TIMER 1 OVERFLOW INTERRUPT
        ;
        ;********************************************************************
        ;*      INITIALIZE ALL REGISTERS & RESET FLAGS AND COUNTERS         *
        ;********************************************************************
        INIT:   MOV     R0,#30H
        INL1:   MOV     @R0,#00H
                INC     R0
                CJNE    R0,#00H,INL1
                MOV     SP,#07H         ;INITIALIZE STACK POINTER
                CLR     WDPASS          ;RESET WATCH-DOG PASS 1 SECOND FLAG
                CLR     PHASE
                CLR     A               ;RESET ACCUMULATOR
                MOV     HALF,A          ;RESET 500MS COUNTER
                MOV     SECOND,A        ;RESET 1 SECOND COUNTER
                MOV     30H,A
                MOV     TMOD,#TMODS     ;SET TIMER MODE CONTROL REGISTER
                MOV     TCON,#TCONS     ;SET TIMER CONTROL REGISTER
                MOV     IE,#IES         ;SET INT ENABLE REGISTER
                MOV     TH1,#63H        ;
                SETB    MS50            ;
                CLR     AT1
                CLR     AT2
                CLR     AT3
                CLR     AT4
                MOV     DPH,#LED1
                SETB    AA17
                MOV     A,#0FFH
                MOVX    @DPTR,A
                CLR     AA17            ;EXTENDED PLD ADDRESS
                MOV     DLYT,#00H
        ;
        ;               ******************************
        ;               * PHASE AND DELAY MEASUREMENT *
        ;               ******************************
        ;
        ;********************************************************************
        ;*                      SENDING OUT TEST TONE                       *
        ;********************************************************************
        TTON:   CLR     FINSH           ;BEGIN TO SEND OUT TEST TONE
                MOV     RG0,#03H
                MOV     R0,#80H
                MOV     R7,#00H
        TON1:   MOV     R6,#90H
        TON2:   NOP                     ;DELAY FOR A/D INTERRUPT
                DJNZ    R6,TON2
                MOV     @R0,ADB1
                INC     R7
                CJNE    R7,#2BH,TON3
                MOV     R7,#00H         ;GENERAT TEST TONE FOR ANOTHER PERIOD
        TON3:   INC     R0
                CJNE    R0,#00H,TON1
                MOV     R0,#80H
                MOV     R7,#00H
```

```
              DJNZ    RG0,TON1        ;FILL THE BUFFER(80--FFH) THREE TIME
              SETB    FINSH           ;STOP SENDING TEST TONE
              MOV     RG1,@R0
              CLR     TMBT1
      TON5:   INC     R0
              MOV     A,@R0
              CLR     C
              SUBB    A,RG1           ;PICK UP THE BIGGEST VALUE FROM 80--FFH
              JC      TON6
              MOV     RG1,@R0         ;SAVE IT TO RG1
      TON6:   CJNE    R0,#0FFH,TON5
              MOV     A,#07H
              CLR     C
              SUBB    A,RG1
              JC      TON9            ;RG1<7?
      TON7:   JNB     AT1,TON8        ;ALL THE ATTENUATIONS ARE RELEASED?
              LCALL   IATTN           ;DECREASE ATTENUATION TILL AT1=0
              LCALL   DELAY           ;DELAY FOR ATTENUATION TO SETTLE DAWN
              AJMP    TTON            ;SENT OUT TEST TONE AGAIN
      TON8:   SETB    NOSIG           ;NO SINGNAL DETECTED, FINISH TEST PROCESS
              MOV     A,#00H
      DDLL:   CPL     A
              MOV     DPH,#LED3
              SETB    AA17
              MOVX    @DPTR,A
              LCALL   DELAY
              LCALL   DELAY
              AJMP    DDLL
      TON9:   MOV     A,#0EFH
              CLR     C
              SUBB    A,RG1
              JC      TST0            ;RG1>6F?
              JNB     AT4,TST0        ;ALL THE ATTENUATION ARE SETTLED?
              LCALL   DATTN           ;INCREASE ATTENUATION ONCE
              LCALL   DELAY
              AJMP    TTON            ;GENERATE TEST TONE AGAIN
      ;
      ;************************************************************************
      ;          DETERMINE DELAY TIME AND VERIFY THE PHASE                    *
      ;************************************************************************
      ;
      ;Use "Moving Ladder" Method to Locate the Neighborhood Where Actual Delay
      ;Resides.
      ;
      TST0:   MOV     R0,#80H         ;DETERMINE DELAY TIME AND VERIFY THE PHASE
              MOV     PKSN,#0D9H      ;PEAK DATA SIGN(+=1,-=0)
              MOV     PKTR,#36H       ;PEAK DATA TREND(INCR=1,DECR=0)
              MOV     RG1,#00H
      TST1:   MOV     R1,#70H
              MOV     R5,#00H         ;READ POSSIBLE PEAK DATA AND PUT IN 70--79H
              MOV     RG0,R0          ;SAVE R0
      TST2:   MOV     A,R5
              MOV     DPTR,#PEAK
              MOVC    A,@A+DPTR
              ADD     A,R0
              MOV     R0,A
              MOV     A,@R0
              MOV     @R1,A
              INC     R1
              INC     R5
              CJNE    R1,#7AH,TST2
      ;
```

```
; Detect Phase
;
            LCALL   CMPR
            MOV     A,PKSN          ;COMPARE THE SIGH OF READED DATA & PEAK DATA
            XRL     A,7DH
            JNZ     TST3            ;SIGN NOT CONCORDED
            MOV     A,PKTR          ;COMPARE THE TREND OF READED DATA & PEAK DATA
            XRL     A,7EH
            JZ      TST5            ;TREND AND SIGN IS OK
            AJMP    TST4            ;TREND NOT CONCORD
   TST3:    XRL     A,#0FFH
            JNZ     TST4            ;SIGN NOT INVERSED
            MOV     A,PKTR          ;COMPARE THE TREND
            ANL     A,7EH
            JNZ     TST4            ;TREND NOT INVERSED
            LCALL   PHCH            ;INVERSE THE PHASE
            LJMP    TST0            ;OUTPUT AND DETECT TEST TONE AGAIN
   TST4:    MOV     R0,RG0          ;NEXT GROUP OF POSSIBLE PEAK DATA
            INC     R0
            CJNE    R0,#0D4H,TST1   ;THE ADD. OF 1ST DATA OF LAST GROUP IS 0D4H
;
;Calculate Cross-correlation and find peak location
;
   TST5:    MOV     65H,RG0         ;CC METHOD IS APPLIED TO DETREMINE THE DELAY
            MOV     66H,#2BH        ;CIRCLE COUNTER
            MOV     6BH,#00H
            MOV     6CH,#00H
   TST6:    MOV     RG1,#00H
            MOV     RG2,#00H
            MOV     RG3,#00H
            MOV     RG4,#00H
            MOV     RG5,#00H
            MOV     RG6,#00H
            MOV     RG7,#00H
            MOV     R1,65H
            MOV     R5,#00H
   TST7:    MOV     A,R5            ;LOAD X
            MOV     DPTR,#TONE
            MOVC    A,@A+DPTR
            MOV     RT1,A
            JNB     ACC.7,TST8      ;DETERMINE THE SIGN OF X
            ANL     A,#7FH          ;    X>0 TMBT1=0, X<0 TMBT1=1
            CLR     TMBT1
            AJMP    TST9
   TST8:    CPL     A
            INC     A
            ANL     A,#7FH
            SETB    TMBT1
   TST9:    MOV     B,A             ;SAVE X TO B
            MOV     A,@R1           ;LOAD Y
            JNB     ACC.7,TSTA      ;DETERMINE THE SIGN OF Y
            ANL     A,#7FH          ;    Y>0 TMBT2=0, Y<0 TMBT2=1
            CLR     TMBT2
            AJMP    TSTB
   TSTA:    CPL     A
            INC     A
            ANL     A,#7FH
            SETB    TMBT2
   TSTB:    MUL     AB              ;X*Y
            MOV     C,TMBT1         ;DETERMINE THE SIGN OF X*Y
            ORL     C,TMBT2
            JNC     TSTC
```

-21-

```
        MOV     C,TMBT1
        ANL     C,TMBT2
        JC      TSTC
        CLR     C
        XCH     A,RG3
        SUBB    A,RG3           ;X*Y<0 SUBSTRACT IT FROM THE SUM OF X*Y
        MOV     RG3,A
        MOV     A,RG2
        SUBB    A,B
        MOV     RG2,A
        MOV     A,RG1
        SUBB    A,#00H
        MOV     RG1,A
        AJMP    TSTD
TSTC:   ADD     A,RG3           ;X*Y>0 ADD IT TO THE SUM OF X*Y (RG1:RG2:RG3)
        MOV     RG3,A
        MOV     A,B
        ADDC    A,RG2
        MOV     RG2,A
        MOV     A,#00H
        ADDC    A,RG1
        MOV     RG1,A
TSTD:   MOV     A,RT1
        ADD     A,RG5           ;+X
        MOV     RG5,A
        MOV     A,#00H
        ADDC    A,RG4
        MOV     RG4,A
        MOV     A,@R1
        ADD     A,RG7           ;+Y
        MOV     RG7,A
        MOV     A,#00H
        ADDC    A,RG6
        MOV     RG6,A
        INC     R1
        INC     R5
        CJNE    R5,#2BH,TST7
        MOV     RT1,RG4
        MOV     RT2,RG5
        MOV     R4,#2BH
        LCALL   DIVS
        MOV     MENX,RT2        ;CALCULATE THE MEAN OF X
        MOV     RT1,RG6
        MOV     RT2,RG7
        MOV     R4,#2BH
        LCALL   DIVS
        MOV     MENY,RT2        ;CALCULATE THE MEAN OF Y
        MOV     A,RG1
        ANL     A,#0F0H         ;TEST THE SIGN OF SUM OF X*Y
        JZ      TSTE
        AJMP    TSTN            ;THE SUM OF X*Y < 0
TSTE:   MOV     A,RG3
        RLC     A
        MOV     A,#00H
        ADDC    A,RG2
        MOV     RG2,A
        MOV     A,#00H
        ADDC    A,RG1
        MOV     RG1,A
        MOV     RG3,RG1
        MOV     RG4,RG2
        LCALL   MULT            ;(SUM OF X*Y)^2, LEFT RESULT TO RT1:RT2:RG1
```

```
            MOV     RT1,R2
            MOV     RT2,R3
            MOV     RG1,R4
            MOV     RG2,#00H
            MOV     RG3,#00H
            MOV     RG4,#00H
            MOV     RG5,#00H
            MOV     RG6,#00H
            MOV     RG7,#00H
            MOV     R1,65H
            MOV     R5,#00H
    TSTF:   MOV     A,R5
            MOV     DPTR,#TONE
            MOVC    A,@A+DPTR
            CLR     C               ;+(X-MENX)^2
            SUBB    A,MENX
            JC      TSTG            ;X<MENX
            AJMP    TSTH
    TSTG:   CPL     A
            INC     A
    TSTH:   MOV     B,A
            MUL     AB
            ADD     A,RG4           ;LEAVE THE SUM. TO RG2:RG3:RG4
            MOV     RG4,A
            MOV     A,B
            ADDC    A,RG3
            MOV     RG3,A
            MOV     A,#00H
            ADDC    A,RG2
            MOV     RG2,A
            MOV     A,@R1
            CLR     C               ;+(Y-MENY)^2
            SUBB    A,MENY
            JC      TSTI
            AJMP    TSTJ
    TSTI:   CPL     A
            INC     A
    TSTJ:   MOV     B,A
            MUL     AB
            ADD     A,RG7           ;LEAVE THE SUM. TO RG5:RG6:RG7
            MOV     RG7,A
            MOV     A,B
            ADDC    A,RG6
            MOV     RG6,A
            MOV     A,#00H
            ADDC    A,RG5
            MOV     RG5,A
            INC     R1
            INC     R5
            CJNE    R5,#2BH,TSTF    ;NEXT GROUP OF X,Y
            MOV     A,RG4           ;ROUNDING THE SUM. OF (X-MENX)^2
            RLC     A               ;    LEFT THE RESULT TO RG1:RG2
            MOV     A,#00H
            ADDC    A,RG3
            MOV     RG3,A
            MOV     A,#00H
            ADDC    A,RG2
            MOV     RG1,A
            MOV     RG2,RG3
            MOV     A,RG7           ;ROUNDING THE SUM. OF (Y-MENY)^2
            RLC     A               ;    LEAVE THE RESULT TO RG3:RG4
            MOV     A,#00H
```

−23−

```
                ADDC    A,RG6
                MOV     RG4,A
                MOV     A,#00H
                ADDC    A,RG5
                MOV     RG3,A
                LCALL   MULT            ;RG1:RG2*RG3:RG4
                MOV     R5,#18H
        TSTK:   MOV     A,R2            ;SHIFT R2:R3:R4 AND RT1:RT2:RG1 ONE BIT LEFT
                JB      ACC.7,TSTL      ;    TOGETHER UNTILL THE 7TH BIT OF R2 OR
                MOV     A,RT1           ;    RT1 IS 1
                JB      ACC.7,TSTL
                CLR     C
                MOV     A,R4
                RLC     A
                MOV     R4,A
                MOV     A,R3
                RLC     A
                MOV     R3,A
                MOV     A,R2
                RLC     A
                MOV     R2,A
                CLR     C
                MOV     A,RG1
                RLC     A
                MOV     RG1,A
                MOV     A,RT2
                RLC     A
                MOV     RT2,A
                MOV     A,RT1
                RLC     A
                MOV     RT1,A
                DJNZ    R5,TSTK
        TSTL:   MOV     A,R2
                JNZ     TSTM            ;R2 > 0
                LJMP    TON8
        TSTM:   MOV     A,R3
                RLC     A               ;ROUNDING R3
                MOV     A,#00H
                ADDC    A,R2
                MOV     R4,A
                LCALL   DIVS            ;CACULATE THE C-C CO-EFFICIENT (RT1:RT2/R4)
                CLR     C
                MOV     A,RT2
                SUBB    A,6CH
                MOV     A,RT1
                SUBB    A,6BH
                JC      TSTN
                MOV     6BH,RT1         ;SAVE THE LARGEST COEFFICIENT TO 6BH:6CH
                MOV     6CH,RT2
                MOV     6AH,65H
        TSTN:   INC     65H
                DJNZ    66H,TSTP
                MOV     A,6BH
                JNZ     TSTO
                MOV     A,6CH
                JB      ACC.7,TSTO
                LJMP    TST4
        TSTO:   MOV     A,6AH
                CLR     C
                SUBB    A,#80H
                MOV     DLYT,A          ; Save DELAY
                LJMP    VCTRL
```

```
TSTP:   LJMP    TST6
;
PHCH:   NOP
        RET
;
DIVS:   MOV     62H,#00H        ;RT1:RT2 DIVIDES R4 BY THE VALUE SUPPLIED
        MOV     63H,#00H
        MOV     60H,#00H        ;ZREO OUT PARTIAL REMAINDER
        MOV     R3,#10H         ;LOOP COUNTER
DIV1:   CLR     C               ;LOOP BEGINS
        MOV     A,RT2
        RLC     A               ;SHIFT THE DIVIDEND AND RETURN MSB IN C
        MOV     RT2,A
        MOV     A,RT1
        RLC     A
        MOV     RT1,A
        MOV     A,60H
        RLC     A               ;SHIFT CARRY INTO LSB OF PARTIAL REMAINDER
        MOV     60H,A
        JC      DIV2            ;CARRY OUT OF 60H SHIFT MEANS 60H > R4
        CLR     C
        MOV     A,60H
        SUBB    A,R4            ;A=60H-R4, CARRY SET IF 60H < R4
        JC      DIV3
DIV2:   CLR     C               ;IF 60H > R4
        MOV     A,60H
        SUBB    A,R4            ;A=60H-R4
        MOV     60H,A
        SETB    C               ;SHIFT A 1 INTO QUOTIENT
        AJMP    DIV4
DIV3:   CLR     C               ;SHIFT A 0 INTO QUOTIENT
DIV4:   MOV     A,63H           ;SHIFT CARRY BIT INTO QUOTIENT
        RLC     A
        MOV     63H,A
        MOV     A,62H
        RLC     A
        MOV     62H,A
        DJNZ    R3,DIV1         ;TEST FOR COMPETION
        CLR     C               ;ROUNDING PARTIAL REMAINDER
        MOV     A,R4
        RRC     A
        CLR     C
        SUBB    A,60H
        MOV     A,#00H
        ADDC    A,63H
        MOV     RT2,A
        MOV     A,#00H
        ADDC    A,62H
        MOV     RT1,A
        RET
MULT:   MOV     R2,#00H
        MOV     R3,#00H
        MOV     R4,#00H
        MOV     A,RG4
        MOV     B,RG2           ;(RG1 RG2)*(RG3 RG4)
        MUL     AB              ;   LEAVING THE RESULT TO R2 R3 R4
        MOV     R4,A
        MOV     R3,B
        MOV     A,RG1
        MOV     B,RG4
        MUL     AB
        ADD     A,R3
```

-25-

```
                MOV     R3,A
                MOV     A,B
                ADDC    A,#00H
                MOV     R2,A
                MOV     A,RG2
                MOV     B,RG3
                MUL     AB
                ADD     A,R3
                MOV     R3,A
                MOV     A,R2
                ADDC    A,B
                MOV     R2,A
                MOV     A,RG1
                MOV     B,RG3
                MUL     AB
                ADD     A,R2
                MOV     R2,A              ;FIRST BYTE IS 0
                RET
        ;
        ;*********************************************************************
        ;*      Subroutine:   DETERMINE THE SIGN AND TREND OF A DATA GROUP   *
        ;*********************************************************************
        CMPR:   MOV     R1,#70H
                MOV     R4,#08H           ;DETERMINE THE SIGN(7DH) AND TREND
                MOV     7DH,#00H          ;   (7EH) OF A GROUP OF DATA
                MOV     7EH,#00H
        CPM1:   MOV     A,@R1
                MOV     R5,A
                MOV     A,#80H
                CLR     C
                SUBB    A,R5              ;COMPARE CURRENT DATA(R5) WITH 0(A)
                MOV     TMBT3,C           ;   TMBT3=1  >0,   TMBT3=0  <0
                INC     R1
                MOV     A,@R1
                CLR     C
                SUBB    A,R5              ;COMPARE CURRENT DATA(R5) WITH SECOND DATA(A)
                MOV     TMBT4,C           ;   TMBT4=0   R5 IS SMALLER
                CPL     TMBT4             ;   TMBT4=1   R5 IS BIGGER
                MOV     A,R1
                ANL     A,#0FH
                DEC     A
                MOV     DPTR,#STTT
                MOVC    A,@A+DPTR
                JMP     @A+DPTR
        STTT:   DB      STT0-STTT,STT1-STTT,STT2-STTT,STT3-STTT
                DB      STT4-STTT,STT5-STTT,STT6-STTT,STT7-STTT
        STT0:   MOV     A,7DH
                MOV     C,TMBT3
                MOV     ACC.7,C
                MOV     7DH,A
                MOV     A,7EH
                MOV     C,TMBT4
                MOV     ACC.7,C
                MOV     7EH,A
                AJMP    CPM2
        STT1:   MOV     A,7DH
                MOV     C,TMBT3
                MOV     ACC.6,C
                MOV     7DH,A
                MOV     A,7EH
                MOV     C,TMBT4
                MOV     ACC.6,C
```

```
                MOV     7EH,A
                AJMP    CPM2
        STT2:   MOV     A,7DH
                MOV     C,TMBT3
                MOV     ACC.5,C
                MOV     7DH,A
                MOV     A,7EH
                MOV     C,TMBT4
                MOV     ACC.5,C
                MOV     7EH,A
                AJMP    CPM2
        STT3:   MOV     A,7DH
                MOV     C,TMBT3
                MOV     ACC.4,C
                MOV     7DH,A
                MOV     A,7EH
                MOV     C,TMBT4
                MOV     ACC.4,C
                MOV     7EH,A
                AJMP    CPM2
        STT4:   MOV     A,7DH
                MOV     C,TMBT3
                MOV     ACC.3,C
                MOV     7DH,A
                MOV     A,7EH
                MOV     C,TMBT4
                MOV     ACC.3,C
                MOV     7EH,A
                AJMP    CPM2
        STT5:   MOV     A,7DH
                MOV     C,TMBT3
                MOV     ACC.2,C
                MOV     7DH,A
                MOV     A,7EH
                MOV     C,TMBT4
                MOV     ACC.2,C
                MOV     7EH,A
                AJMP    CPM2
        STT6:   MOV     A,7DH
                MOV     C,TMBT3
                MOV     ACC.1,C
                MOV     7DH,A
                MOV     A,7EH
                MOV     C,TMBT4
                MOV     ACC.1,C
                MOV     7EH,A
                AJMP    CPM2
        STT7:   MOV     A,7DH
                MOV     C,TMBT3
                MOV     ACC.0,C
                MOV     7DH,A
                MOV     A,7EH
                MOV     C,TMBT4
                MOV     ACC.0,C
                MOV     7EH,A
                AJMP    CPM2
        CPM2:   DEC     R4
                MOV     A,R4
                JZ      CPM3
                LJMP    CPM1
        CPM3:   RET
                ;
```

```
;         *************************************
;         *         VOLUME TRACKING           *
;         *************************************
;
;**************************************************************************
;*                        INITIALIZATION                                  *
;**************************************************************************
        VCTRL:  CLR     ATTPC           ;CLEAR ATTENUATION PROCESS FLAG
                CLR     TREND           ;CLEAR TREND VERIFICATION FLAG
                CLR     MUTCL
                CLR     BASIG
                CLR     FINSH
                CLR     KYBRD           ;CLEAR KEYBOARD INTERRUPT PROCESS FLAG
                CLR     A
                MOV     R1,#4AH
        DAPRE:  INC     R1              ;CLEAR BUFFER 4C - FFH
                MOV     @R1,A
                CJNE    R1,#0FFH,DAPRE
                SETB    FINSH
                SETB    INVOL           ;BEGIN INITIATION PROCESS
                MOV     R7,#0E0H
                MOV     A,DLYT
                JZ      DAPR1
                SETB    DLYFL           ;TIME DELAY IS AVAILABLE
                AJMP    MNCRT
        DAPR1:  CLR     DLYFL           ;TIME DELAY IS NOT AVAILABLE
        MNCRT:  MOV     A,DLYT
                MOV     B,#10H          ;DECIDE THE INITIALIZATION CYCLE ACCORDING
                DIV     AB              ;   TO THE DELAY TIME, SAVE IT TO RG0
                MOV     RG0,A
                INC     RG0
                MOV     R0,#80H
                MOV     ACRC,DLYT
        DELIN:  MOV     R4,#10H         ;DELAY FOR ANOTHER CYCLE
        DELN2:  MOV     R5,#0FFH
                JB      CIRCL,CRT01     ;16 SAMPLE TIME FINISHED
                DJNZ    R5,DELN2
                DJNZ    R4,DELIN
        CRT01:  CLR     CIRCL
                MOV     R1,#0E0H        ;RELOCATE THE BUFFER, GET LAST 16 SAMPLE DATA
                MOV     60H,@R1         ;  FROM E0-EFH(Y) AND F0-FFH(X), PUT IT TO
                INC     R1              ;  60-6FH(Y) AND 70-7FH(X)
                MOV     61H,@R1
                INC     R1
                MOV     62H,@R1
                INC     R1
                MOV     63H,@R1
                INC     R1
                MOV     64H,@R1
                INC     R1
                MOV     65H,@R1
                INC     R1
                MOV     66H,@R1
                INC     R1
                MOV     67H,@R1
                INC     R1
                MOV     68H,@R1
                INC     R1
                MOV     69H,@R1
                INC     R1
                MOV     6AH,@R1
                INC     R1
```

```
            MOV     6BH,@R1
            INC     R1
            MOV     6CH,@R1
            INC     R1
            MOV     6DH,@R1
            INC     R1
            MOV     6EH,@R1
            INC     R1
            MOV     6FH,@R1
            MOV     R1,#0F0H
            MOV     70H,@R1
            INC     R1
            MOV     71H,@R1
            INC     R1
            MOV     72H,@R1
            INC     R1
            MOV     73H,@R1
            INC     R1
            MOV     74H,@R1
            INC     R1
            MOV     75H,@R1
            INC     R1
            MOV     76H,@R1
            INC     R1
            MOV     77H,@R1
            INC     R1
            MOV     78H,@R1
            INC     R1
            MOV     79H,@R1
            INC     R1
            MOV     7AH,@R1
            INC     R1
            MOV     7BH,@R1
            INC     R1
            MOV     7CH,@R1
            INC     R1
            MOV     7DH,@R1
            INC     R1
            MOV     7EH,@R1
            INC     R1
            MOV     7FH,@R1
            JNB     KYBRD,CRT02    ;KEYBOARD INTR. FLAG IS SET, FRESH BUFFER
            CLR     KYBRD
            SETB    INVOL
            AJMP    DELIN
    CRT02:  JNB     INVOL,CRT05
            JNB     DLYFL,CRT03    ;THERE IS NO DELAY
            DJNZ    RG0,CRT06      ;THE INIITIAL CYCLE NOT FINISHED
    CRT03:  MOV     R1,#4EH
    CRT04:  MOV     @R1,#00H       ;FRESH THE BUFFER 4BH--5FH
            INC     R1
            CJNE    R1,#60H,CRT04
            CLR     INVOL          ;CLEAR INITIATION FLAG
            SETB    BEGIN          ;BEGIN THE FIRST VERIFICATION CICLE AND FLUSH
            AJMP    DELIN          ;   THE BUFFER
    CRT05:  JNB     ATTPC,CRT41    ;IS THERE AN ATTENUATION GOING ON?
            CLR     ATTPC
            SETB    BEGIN          ;WAITING A CYCLE FOR ATTENUATION TO SETTLE
    CRT06:  AJMP    DELIN          ;   DOWN
;
;
;***********************************************************************
```

```
;       Determine At dynamically based on A/D input level              *
;       At is saved at ATTY1, ATTY2, and ATTY3                         *
;***********************************************************************
;
;***********************************************************************
;*                      CACULATE Vx AND Vy                             *
;***********************************************************************
CRT41:  MOV     R2,#00H
        MOV     R3,#00H
        MOV     RT1,#00H
        MOV     R1,#60H         ;@60H+@61H+....+@6EH+@6FH (ABSOLUTE VALUE)
CRT42:  MOV     A,@R1           ;    SELECT THE BIGGEST VALUE AMONG 60H--6FH
        JB      ACC.7,CRT43     ;    AND SAVE IT TO RT1
        MOV     B,A
        MOV     A,#80H          ;#80H IS THE RELATIVE 0 POINT
        CLR     C
        SUBB    A,B
        AJMP    CRT44
CRT43:  ANL     A,#7FH          ;A-#80H
CRT44:  MOV     R6,A
        SUBB    A,RT1           ;COMPARE CURRENT VALUE TO THE BIGGEST VALUE
        JC      CRT45           ;A < RT1
        MOV     RT1,R6          ;A > RT1, SAVE CURRENT VALUE AS BIGGEST VALUE
CRT45:  MOV     A,R6
        ADD     A,R3
        MOV     R3,A
        MOV     A,#00H
        ADDC    A,R2
        MOV     R2,A
        INC     R1
        CJNE    R1,#70H,CRT42
        MOV     ABY1,R2
        MOV     ABY2,R3
        MOV     R2,#00H
        MOV     R3,#00H
        MOV     RT2,#00H
        MOV     R1,#70H         ;@70H+@71H+....+@7EH+@7FH (ABSOLUTE VALUE)
CRT46:  MOV     A,@R1           ;    SELECT THE BIGGEST VALUE AND SAVE IT
        JB      ACC.7,CRT47     ;    TO RT2
        MOV     RG1,#00H
        INC     RG0
        MOV     B,A
        MOV     A,#80H
        CLR     C
        SUBB    A,B
        AJMP    CRT48
CRT47:  MOV     RG0,#00H
        INC     RG1
        ANL     A,#7FH
CRT48:  MOV     R6,A
        SUBB    A,RT2
        JC      CRT49
        MOV     RT2,R6
CRT49:  MOV     A,R6
        ADD     A,R3
        MOV     R3,A
        MOV     A,#00H
        ADDC    A,R2
        MOV     R2,A
        INC     R1
        CJNE    R1,#80H,CRT46
        MOV     ABX1,R2
```

```
            MOV     ABX2,R3
    ;
    ;************************************************************************
    ;*      ANALYZE Vx AND Vy, IF IT IS TOO SMALL, NO ACTION                *
    ;************************************************************************
            CLR     BASIG                   ;ANALYZE THE VALUE OF Y AND X SIGNAL
            MOV     A,#78H                  ;   IF   MAX(ABS(Y)) > 78
            CLR     C                       ;        OR MAX(ABS(X)) > 78
            SUBB    A,RT1                   ;        OR SIG(ABS(X)) < 48
            JC      CRT52                   ;        OR SIG(ABS(Y)) < 32
            MOV     A,#78H                  ;   THE SIGNAL IS NOT GOOD FOR VALUME TRACKING
            CLR     C                       ;   OTHERWISE SIGNAL IS OK
            SUBB    A,RT2
            JC      CRT52
            MOV     A,ABX1
            JNZ     CRT51
            MOV     A,#48H
            CLR     C
            SUBB    A,ABX2
            JNC     CRT52
    CRT51:  MOV     A,ABY1
            JNZ     CRT11
            MOV     A,#32H
            CLR     C
            SUBB    A,ABY2
            JC      CRT11
    CRT52:  SETB    BASIG                   ;SIGNAL IS NOT GOOD
            AJMP    DELIN
    ;
    ;************************************************************************
    ;*              CROSS CORELATION FACTOR (Cxy^2) CALCULATION             *
    ;************************************************************************
    CRT11:  MOV     R2,#00H
            MOV     R3,#00H
            MOV     R4,#00H
            MOV     R1,#60H
    CRT12:  MOV     A,@R1                   ;@60H+@61H+....+@6EH+@6FH
            ADD     A,R4                    ;   LEAVING HIGH BYTE TO R3
            MOV     R4,A                    ;   LEAVING LOW BYTE TO R4
            MOV     A,R3
            ADDC    A,#00H
            MOV     R3,A
            INC     R1
            CJNE    R1,#70H,CRT12
            MOV     A,R4
            JNB     ACC.3,CRT13             ;(@60H+@61H+....+@6EH+@6FH)/16
            INC     R2                      ;   ROTATE RIGHT 4 BIT TO GET MEAN VALUE
    CRT13:  ANL     A,#0F0H                 ;   LEAVING RESULT TO MENY
            SWAP    A                       ;00:2H
            ADD     A,R2                    ;ADD CARRY
            MOV     R2,A
            MOV     A,R3                    ;00:1L (4 MSB OF R3 IS 0)
            SWAP    A                       ;1L:00
            ADD     A,R2                    ;A=1L:2H
            MOV     MENY,A
            MOV     R2,#00H
            MOV     R3,#00H
            MOV     R4,#00H
            MOV     R1,#70H
    CRT14:  MOV     A,@R1                   ;@70H+@71H+....+@7EH+@7FH
            ADD     A,R4                    ;   LEAVING HIGH BYTE TO R3
            MOV     R4,A                    ;   LEAVING LOW BYTE TO R4
```

```
              MOV     A,R3
              ADDC    A,#00H
              MOV     R3,A
              INC     R1
              CJNE    R1,#80H,CRT14
              MOV     A,R4
              JNB     ACC.3,CRT15     ;(@70H+@71H+....+@7EH+@7FH)/16
              INC     R2              ;   ROTATE RIGHT 4 BIT TO GET MEAN VALUE
     CRT15:   ANL     A,#0F0H         ;   LEAVING RESULT TO MENX
              SWAP    A
              ADD     A,R2
              MOV     R2,A
              MOV     A,R3
              SWAP    A
              ADD     A,R2
              MOV     MENX,A
      ;
      ;............................................................
      ;       CALCULATION OF B
      ;````````````````````````````````````````````````````````````
              MOV     RG0,#00H
              MOV     RG1,#00H
              MOV     RG2,#00H
              MOV     R1,#60H         ;CALCULATE (@60H-MENY)^2+(@61H-MENY)^2+....
     CRT21:   MOV     A,@R1           ;   +(@6EH-MENY)^2+(@6FH-MENY)^2
              CLR     C               ;   LEAVING THE RESULT TO RG0:RG1:RG2
              SUBB    A,MENY
              JC      CRT22           ;MENY>Y
              AJMP    CRT23
     CRT22:   CPL     A
              INC     A
     CRT23:   MOV     B,A
              MUL     AB              ;(Y-MENY)*(Y-MENY)
              ADD     A,RG2
              MOV     RG2,A
              MOV     A,B
              ADDC    A,RG1
              MOV     RG1,A
              MOV     A,#00H
              ADDC    A,RG0
              MOV     RG0,A
              INC     R1
              CJNE    R1,#70H,CRT21
      ;
      ;............................................................
      ;       CALCULATION OF C
      ;````````````````````````````````````````````````````````````
              MOV     RG3,#00H
              MOV     RG4,#00H
              MOV     RG5,#00H
              MOV     R1,#70H         ;CALCULATE (@70H-MENX)^2+(@71H-MENX)^2+....
     CRT24:   MOV     A,@R1           ;   +(@7EH-MENX)^2+(@7FH-MENX)^2
              CLR     C               ;   LEAVING THE RESULT TO RG3:RG4:RG5
              SUBB    A,MENX
              JC      CRT25
              AJMP    CRT26
     CRT25:   CPL     A
              INC     A
     CRT26:   MOV     B,A
              MUL     AB
              ADD     A,RG5
              MOV     RG5,A
```

```
              MOV     A,B
              ADDC    A,RG4
              MOV     RG4,A
              MOV     A,#00H
    5         ADDC    A,RG3
              MOV     RG3,A
              INC     R1
              CJNE    R1,#80H,CRT24
         ;
   10    ;.................................................
         ;   CALCULATION OF A
         ;`````````````````````````````````````````````````
              MOV     R2,#00H
              MOV     R3,#00H
   15         MOV     R4,#00H
              MOV     RT1,60H         ;(60H*70H+61H*71H+....+6EH*7EH+6FH*7FH)
              MOV     RT2,70H         ;    LEAVING THE MESSAGE TO R2:R3:R4
              LCALL   MTXY
              MOV     RT1,61H         ;+61H*71H
   20         MOV     RT2,71H
              LCALL   MTXY
              MOV     RT1,62H         ;+62H*72H
              MOV     RT2,72H
              LCALL   MTXY
   25         MOV     RT1,63H         ;+63H*73H
              MOV     RT2,73H
              LCALL   MTXY
              MOV     RT1,64H         ;+64H*74H
              MOV     RT2,74H
   30         LCALL   MTXY
              MOV     RT1,65H         ;+65H*75H
              MOV     RT2,75H
              LCALL   MTXY
              MOV     RT1,66H         ;+66H*76H
   35         MOV     RT2,76H
              LCALL   MTXY
              MOV     RT1,67H         ;+67H*77H
              MOV     RT2,77H
              LCALL   MTXY
   40         MOV     RT1,68H         ;+68H*78H
              MOV     RT2,78H
              LCALL   MTXY
              MOV     RT1,69H         ;+69H*79H
              MOV     RT2,79H
   45         LCALL   MTXY
              MOV     RT1,6AH         ;+6AH*7AH
              MOV     RT2,7AH
              LCALL   MTXY
              MOV     RT1,6BH         ;+6BH*7BH
   50         MOV     RT2,7BH
              LCALL   MTXY
              MOV     RT1,6CH         ;+6CH*7CH
              MOV     RT2,7CH
              LCALL   MTXY
   55         MOV     RT1,6DH         ;+6DH*7DH
              MOV     RT2,7DH
              LCALL   MTXY
              MOV     RT1,6EH         ;+6EH*7EH
              MOV     RT2,7EH
   60         LCALL   MTXY
              MOV     RT1,6FH         ;+6FH*7FH
              MOV     RT2,7FH
```

−33−

```
            LCALL   MTXY
            CLR     TREND
            MOV     A,R2
            ANL     A,#0F0H
            JZ      CRT31           ;SUM OF X*Y > 0, GOTO CRT31
            SETB    TREND           ;A<0, NO ACTION
            AJMP    CRT34
    CRT31:  SETB    TMBT1
    CRT32:  CLR     C               ;SHIFT R2:R3:R4, RG0:RG1:RG2 & RG3:RG4:RG5
            MOV     A,R4            ;    TWO BIT LEFT TOGETHER
            RLC     A
            MOV     R4,A
            MOV     A,R3
            RLC     A
            MOV     R3,A
            MOV     A,R2
            RLC     A
            MOV     R2,A
            CLR     C
            MOV     A,RG2
            RLC     A
            MOV     RG2,A
            MOV     A,RG1
            RLC     A
            MOV     RG1,A
            MOV     A,RG0
            RLC     A
            MOV     RG0,A
            CLR     C
            MOV     A,RG5
            RLC     A
            MOV     RG5,A
            MOV     A,RG4
            RLC     A
            MOV     RG4,A
            MOV     A,RG3
            RLC     A
            MOV     RG3,A
            JNB     TMBT1,CRT33     ;SHIFT IS FINISHED
            CLR     TMBT1
            AJMP    CRT32           ;BEGIN NEXT SHIFT
    CRT33:  MOV     A,R4            ;ROUNDING R4, LEAVING THE RESULT TO RT1:RT2
            RLC     A               ;    = SIG(X*Y)
            MOV     A,#00H
            ADDC    A,R3
            MOV     RT2,A
            MOV     A,#00H
            ADDC    A,R2
            MOV     RT1,A
            MOV     A,RG2           ;ROUNDING RG2, LEAVING THE RESULT TO RG0 RG1
            RLC     A               ;    = 16*Ry^2
            MOV     A,RG1
            ADDC    A,#00H
            MOV     RG1,A
            MOV     A,RG0
            ADDC    A,#00H
            MOV     RG0,A
            MOV     A,RG5           ;ROUNDING RG5, LEAVING THE RESULT TO RG3 RG4
            RLC     A               ;    = 16*Rx^2
            MOV     A,RG4
            ADDC    A,#00H
            MOV     RG4,A
```

```
                MOV     RG2,RG3
                MOV     RG3,RG4
                LCALL   MUT1            ;(RG0:RG1)*(RG3:RG4), SAVE RESULT TO R4:R5
                MOV     A,#0D0H         ;R4:R5*0.69, LEAVE THE RESULT TO RG4:RG5
                MOV     B,R5
                MUL     AB
                RLC     A               ;ROUNDING THE 3RD BYTE
                MOV     A,#00H
                ADDC    A,B
                MOV     RG5,A
                MOV     A,#0B0H
                MOV     B,R4
                MUL     AB
                ADDC    A,RG5
                MOV     RG5,A
                MOV     A,#00H
                ADDC    A,B
                MOV     RG4,A
                MOV     RG0,RT1         ;(RT1:RT2)^2 ( (SIG(X*Y))^2 )
                MOV     RG1,RT2
                MOV     RG2,RT1
                MOV     RG3,RT2
                LCALL   MUT1
;
;********************************************************************
;*  DETERMINE IF Cxy>THRESHELD AND IF CONSECTIVE COUNT OF Cxy>THRESHELD  *
;********************************************************************
                CLR     C
                MOV     A,R5            ;(R4:R5)-(RG4:RG5)
                SUBB    A,RG5           ;RESULT>0, (SIG(X*Y))^2 < 0.69*(Rx*Ry*16)^2
                MOV     A,R4            ;  Cxy < 0.85, TREND IS NOT OK
                SUBB    A,RG4           ;RESULT<0, (SIG(X*Y))^2 < 0.69*(Rx*Ry*16)^2
                MOV     TREND,C         ;  Cxy < 0.85, TREND IS OK
                JNB     TREND,CRT36
CRT34:          MOV     47H,#00H
                INC     48H
                MOV     A,48H
                CJNE    A,#08H,CRT35
                MOV     48H,#00H
                SETB    TRNVF
CRT35:          AJMP    DELIN
CRT36:          MOV     48H,#00H
                INC     47H
                MOV     A,47H
                CJNE    A,#10H,CRT37
                MOV     47H,#00H
                CLR     TRNVF
CRT37:          JNB     TRNVF,CRT53
                AJMP    DELIN           ;MUTE OUTPUT IF NOT CORRELATED FOR # OF TIMES
;
;********************************************************************
;*          CALCULATE THE THE RATIO OF Y/X in LOG DOMAIN            *
;********************************************************************
CRT53:          MOV     R1,#4AH
                MOV     A,ABY2          ;SHIFT LEFT ABY1:ABY2 4 BIT (/16)
                SWAP    A               ;A=2L:2H
                MOV     @R1,A
                MOV     A,ABY1
                SWAP    A               ;A=1L:00
                XCHD    A,@R1           ;A=1L:2H  @R1=2L:00
                MOV     ABY1,A          ;RG2=1L:2H
                MOV     ABY2,@R1        ;RG3=2L:00
```

```
                MOV     A,ABX2          ;SHIFT LEFT ABX1:ABX2 4 BIT (/16)
                SWAP    A               ;A=2L:2H
                MOV     @R1,A
                MOV     A,ABX1
        5       SWAP    A               ;A=1L:00
                XCHD    A,@R1           ;A=1L:2H  @R1=2L:00
                MOV     ABX1,A          ;R2=1L:2H
                MOV     ABX2,@R1        ;R3=2L:00
                JNB     BEGIN,CRT54
        10      MOV     LEY1,ABY1       ;IT IS THE BEGINNIG CYCLE, USE THE CURRENT
                MOV     LEY2,ABY2       ;   VALUE AS THE LAST TIME ONES
                MOV     LEX1,ABX1
                MOV     LEX2,ABX2
                CLR     BEGIN
        15  CRT54:  MOV RG0,ABY1        ;USE THE SMOOTH FILTER TO CALCULAT THE
                MOV     RG1,ABY2        ;   AVERAGE OF SIG(ABS(Y)), THE FACT IS
                MOV     RG2,LEY1        ;   248:8, SAVE THE RESULT TO R4:R5
                MOV     RG3,LEY2
                MOV     RG4,#08H
        20      LCALL   SMFT
                MOV     LEY1,R4
                MOV     LEY2,R5
                MOV     R6,#00H
                CLR     C
        25  CRT55:  MOV A,R4            ;SHIFT R4:R5 RIGHT TOGETHER UNTILL R4 IS 0
                JZ      CRT56
                CLR     C
                RRC     A
                MOV     R4,A
        30      MOV     A,R5
                RRC     A
                MOV     R5,A
                INC     R6              ;RECORD THE TIMES OF SHIFT
                AJMP    CRT55
        35  CRT56:  JNC CRT57           ;ROUNDING THE LAST BIT SHIFTING OUT
                INC     R5              ; IF R5 BECOME 0 (ORGINAL VALUE IS FF)
                MOV     A,R5            ; THEN R5=#80H, PROPAGATE R6
                JNZ     CRT57
                MOV     R5,#80H
        40      INC     R6
            CRT57:  MOV RT1,R5          ;SAVE R5 TO RT1
                MOV     RG0,ABX1        ;SAME OPERATION FOR X
                MOV     RG1,ABX2
                MOV     RG2,LEX1
        45      MOV     RG3,LEX2
                MOV     RG4,#08H
                LCALL   SMFT
                MOV     LEX1,R4
                MOV     LEX2,R5
        50      CLR     C
            CRT58:  MOV A,R4
                JZ      CRT59
                CLR     C
                RRC     A
        55      MOV     R4,A
                MOV     A,R5
                RRC     A
                MOV     R5,A
                DEC     R6
        60      AJMP    CRT58
            CRT59:  JNC CRT5A
                INC     R5
```

−36−

```
            MOV     A,R5
            JNZ     CRT5A
            MOV     R5,#80H
            DEC     R6
   CRT5A:   MOV     RT2,R5
            CLR     TMBT4           ;R6 IS THE DIFFENCE OF THE TIMES THAT X, Y
            MOV     A,R6            ;   SHIFT RIGHT
            JZ      CRT61           ;R6=0
            ANL     A,#0F0H
            JZ      CRT5B
            SETB    TMBT4           ;IF R6>16(R6<0), X SHIFT MORE THAN Y
            MOV     A,R6            ;   THE RESULT OF Y/X SHOULD BE DIVIDED BY
            CPL     A               ;   CERTAIN DATA Z
            INC     A               ;IF R6>0, Y SHIFT MORE THAN X
            MOV     R6,A            ;   THE RESULT OF Y/X SHOULD BE MULTIPED BY
   CRT5B:   MOV     A,#01H          ;   CERTAIN DATA Z
   CRT5C:   RL      A
            DJNZ    R6,CRT5C
            MOV     R6,A            ;GET THE CERTAIN DATA Z=2^(ABS(R6))
   CRT61:   MOV     RG2,#00H
            MOV     DPTR,#LKT1      ;GET LOG(Y) FROM LOOK-UP TABLE
            MOV     A,RT1
            MOVC    A,@A+DPTR
            MOV     RG3,A           ;MOVE INTEGER BYTE OF LOG(Y) TO RG3
            MOV     DPTR,#LKT2
            MOV     A,RT1
            MOVC    A,@A+DPTR
            MOV     RG4,A           ;MOVE HIGH FRACTION BYTE OF LOG(Y) TO RG4
            MOV     DPTR,#LKT3
            MOV     A,RT1
            MOVC    A,@A+DPTR       ;GET LOW FRAC. BYTE OF LOG(Y) FROM L-TABLE
            ADD     A,ATTY3         ;LOG(Y)+ATTY (3RD BYTE)
            MOV     RG5,A
            MOV     A,RG4
            ADDC    A,ATTY2         ;LOG(Y)+ATTY (2ND BYTE)
            MOV     RG4,A
            MOV     A,RG3
            ADDC    A,ATTY1         ;LOG(Y)+ATTY (1ST BYTE)
            MOV     RG3,A
            MOV     A,#00H
            ADDC    A,RG2
            MOV     RG2,A           ;MOVE CARRY TO RG2
            MOV     A,#90H
            ADD     A,RG3           ;+REFF
            MOV     RG3,A
            MOV     A,#00H
            ADDC    A,RG2
            MOV     RG2,A
            MOV     DPTR,#LKT1      ;GET LOG(X) FROM LOOK-UP TABLE
            MOV     A,RT2
            MOVC    A,@A+DPTR
            MOV     R3,A            ;MOVE INTEGER BYTE OF LOG(X) TO R3
            MOV     DPTR,#LKT2
            MOV     A,RT2
            MOVC    A,@A+DPTR
            MOV     R4,A            ;MOVE HIGH FRACTION BYTE OF LOG(X) TO R4
            MOV     DPTR,#LKT3
            MOV     A,RT2
            MOVC    A,@A+DPTR
            MOV     R5,A            ;MOVE LOW FRACTION BYTE OF LOG(X) TO R5
            CLR     C
            MOV     A,RG5
```

–37–

```
           SUBB    A,R5            ;REFF+LOG(Y)-LOG(X)+ATTY
           MOV     RG5,A           ;MOVE LOW FRAC. BYTE TO RG5
           MOV     A,RG4
           SUBB    A,R4
    5      MOV     RG4,A           ;MOVE HIGH FRAC. BYTE TO RG4
           MOV     A,RG3
           SUBB    A,R3
           MOV     RG3,A           ;MOVE LOW INTEGER BYTE TO RG3
           MOV     A,RG2
   10      SUBB    A,#00H
           MOV     RG2,A           ;MOVE HIGH INTEGER BYTE TO RG2
           MOV     DPTR,#LKT1      ;GET LOG(Z) FROM LOOK-UP TABLE
           MOV     A,R6
           MOVC    A,@A+DPTR
   15      MOV     R3,A            ;MOVE INTEGER BYTE OF LOG(Z) TO R3
           MOV     DPTR,#LKT2
           MOV     A,R6
           MOVC    A,@A+DPTR
           MOV     R4,A            ;MOVE HIGH FRACTION BYTE OF LOG(Z) TO R4
   20      MOV     DPTR,#LKT3
           MOV     A,R6
           MOVC    A,@A+DPTR
           MOV     R5,A            ;MOVE LOW FRACTION BYTE OF LOG(Z) TO R5
           JB      TMBT4,CRT62     ;IF R6>0 (TMBT4=0)
   25      MOV     A,RG5           ; RATIO=LOG(Y)+ATTY+REFF+LOG(Z)-LOG(X)
           ADD     A,R5
           MOV     RG5,A
           MOV     A,RG4
           ADDC    A,R4
   30      MOV     RG4,A
           MOV     A,RG3
           ADDC    A,R3
           MOV     RG3,A
           MOV     A,RG2
   35      ADDC    A,#00H
           MOV     RG2,A
           AJMP    CRT63
   CRT62:  CLR     C               ;IF R6<0 (TMBT4=1)
           MOV     A,RG5           ; RATIO=LOG(Y)+ATTY+REFF-LOG(Z)-LOG(X)
   40      SUBB    A,R5
           MOV     RG5,A
           MOV     A,RG4
           SUBB    A,R4
           MOV     RG4,A
   45      MOV     A,RG3
           SUBB    A,R3
           MOV     RG3,A
           MOV     A,RG2
           SUBB    A,#00H
   50      MOV     RG2,A
   CRT63:  ANL     A,#0F0H
           JZ      CRT64
           MOV     RG3,#00H        ;IF RATIO<0  THEN RATIO=0
           MOV     RG4,#00H
   55      AJMP    CRT65
   CRT64:  MOV     A,RG5
           RLC     A               ;ROUNDING LOW FRACTION BYTE
           MOV     A,#00H
           ADDC    A,RG4           ;ADD CARRY TO HIGH FRACTION BYTE
   60      MOV     RG4,A
           MOV     A,#00H
           ADDC    A,RG3
```

– 38 –

```
                MOV     RG3,A
                MOV     A,#00H
                ADDC    A,RG2
                JZ      CRT65
                MOV     RG3,#0FFH       ;IF RATIO>255  THEN RATIO=255
                MOV     RG4,#00H
        ;
        ;**********************************************************************
        ;*          CALCULATE AND OUTPUT Do                                   *
        ;**********************************************************************
        CRT65:  MOV     RG0,RG3         ;SMOOTH FILTER FOR RG3:RG4
                MOV     RG1,RG4
                MOV     RG2,LST1
                MOV     RG3,LST2
                MOV     RG4,#01H
                LCALL   SMFT
                MOV     LST1,R4
                MOV     LST2,R5
                MOV     A,R5
                RLC     A               ;ROUNDING 2ND BYTE
                MOV     A,#00H
                ADDC    A,R4
                MOV     RG0,A
                MOV     40H,A
                MOV     A,VOLSR         ;CALCULATE SURROUND RIGHT OUTPUT
                ADD     A,RG0
                JNC     CRT71
                MOV     RG1,#0FFH       ;RG1>255, THEN RG1=255
                AJMP    CRT72
        CRT71:  MOV     RG1,A
                CLR     C
                SUBB    A,#24H
                JNC     CRT72
                MOV     RG1,#00H        ;RG1<24H, MUTE THE CHANNAL
        CRT72:  MOV     A,RG1
                CPL     A
                MOV     DPL,#00H        ;SELECT SUR. RIGHT CHANNEL
                MOV     DPH,#DAC_WR
                MOVX    @DPTR,A         ;OUTPUT TO SUR. RIGHT CHANNEL
        CRT73:  MOV     A,VOLSL
                ADD     A,RG0
                JC      CRT74
                MOV     RG1,A
                CLR     C
                SUBB    A,#36H
                JNC     CRT75
                SETB    MUTSL
                AJMP    CRT76
        CRT74:  MOV     RG1,#0FFH
        CRT75:  MOV     A,RG1
                CPL     A
                MOV     DPL,#01H
                MOV     DPH,#DAC_WR
                MOVX    @DPTR,A         ;OUTPUT TO SUR. LEFT CHANNEL
        CRT76:  MOV     A,VOLC
                ADD     A,RG0
                JC      CRT77
                MOV     RG1,A
                CLR     C
                SUBB    A,#36H
                JNC     CRT78
                SETB    MUTSR
```

−39−

```
        AJMP    CRT79
CRT77:  MOV     RG1,#0FFH
CRT78:  MOV     A,RG1
        CPL     A
        MOV     DPL,#02H
        MOV     DPH,#DAC_WR
        MOVX    @DPTR,A         ;OUTPUT TO CENTER CHANNEL
CRT79:  MOV     A,VOLSB
        ADD     A,RG0
        JC      CRT7A
        MOV     RG1,A
        CLR     C
        SUBB    A,#36H
        JNC     CRT7B
        SETB    MUTSR
        AJMP    CRT7C
CRT7A:  MOV     RG1,#0FFH
CRT7B:  MOV     A,RG1
        CPL     A
        MOV     DPL,#03H
        MOV     DPH,#DAC_WR
        MOVX    @DPTR,A         ;OUTPUT TO SUR. WOOFER CHANNEL
CRT7C:  LJMP    DELIN           ;NEXT CYCLE
;
;***********************************************************************
;*                      FUNCTION SUBROUTINES                           *
;***********************************************************************
MTXY:   MOV     A,RT1           ;(RT1-#80H)*(RT2-#80H), LEAVE RESULT TO
        JNB     ACC.7,MT01      ;  R2:R3:R4
        ANL     A,#7FH          ;IF RT1>#80H, THE RT1-#80H TO B, TMBT1=0
        CLR     TMBT1
        AJMP    MT02
MT01:   CLR     C               ;IF RT1<#80H, THE #80H-RT1 TO B, TMBT1=1
        MOV     A,#80H
        SUBB    A,RT1
        SETB    TMBT1
MT02:   MOV     B,A
        MOV     A,RT2
        JNB     ACC.7,MT03
        ANL     A,#7FH          ;IF RT2>#80H, THE RT2-#80H TO A, TMBT2=0
        CLR     TMBT2
        LJMP    MT04
MT03:   CLR     C               ;IF RT2>#80H, THE #80H-RT2 TO A, TMBT2=1
        MOV     A,#80H
        SUBB    A,RT2
        SETB    TMBT2
MT04:   MUL     AB              ;A*B
        MOV     C,TMBT1
        ORL     C,TMBT2
        JNC     MT05
        MOV     C,TMBT1
        ANL     C,TMBT2
        JC      MT05
        CLR     C               ;IF OR LOGIC OF TMBT1 AND TMBT2 IS 0 (A*B<0)
        XCH     A,R4            ;  THEN R2:R3:R4=R2:R3:R4-B:A
        SUBB    A,R4
        MOV     R4,A
        MOV     A,R3
        SUBB    A,B
        MOV     R3,A
        MOV     A,R2
        SUBB    A,#00H
```

```
        MOV     R2,A
        RET
MT05:   ADD     A,R4            ;IF AND LOGIC OF TMBT1 AND TMBT2 IS 1 (A*B>0)
        MOV     R4,A            ;THEN R2:R3:R4=R2:R3:R4+B:A
        MOV     A,B
        ADDC    A,R3
        MOV     R3,A
        MOV     A,#00H
        ADDC    A,R2
        MOV     R2,A
        RET

MUT1:   MOV     R4,#00H         ;RG0:RG1*RG2:RG3, THE FIRST BYTE OF RESULT
        MOV     R5,#00H         ;   IS 0, ROUNDING LAST BYTE, SAVE FINAL
        MOV     A,RG1           ;   RESULT TO R4 R5
        MOV     B,RG3
        MUL     AB
        MOV     R6,A            ;LOW ORDER RESULT
        MOV     R5,B            ;HIGH ORDER RESULT
        MOV     A,RG1
        MOV     B,RG2
        MUL     AB
        ADD     A,R5
        MOV     R5,A
        MOV     A,#00H
        ADDC    A,B             ;INCLUDE CARRY FROM PREVIOUS RESULT
        MOV     R4,A
        MOV     A,RG0
        MOV     B,RG3
        MUL     AB
        ADD     A,R5
        MOV     R5,A
        MOV     A,R4
        ADDC    A,B
        MOV     R4,A
        MOV     A,RG0
        MOV     B,RG2
        MUL     AB
        ADD     A,R4
        MOV     R4,A            ;B IS 0
        MOV     A,R6
        RLC     A               ;ROUNDING THE 4TH BYTE OF RESULT
        MOV     A,#00H
        ADDC    A,R5
        MOV     R5,A
        MOV     A,#00H
        ADDC    A,R4
        MOV     R4,A
        RET
SMFT:   MOV     A,RG1           ;SMOOTH FILTER (RG0:RG1)*RG4
        MOV     B,RG4           ;  +(RG2:RG3)*(1:00-RG4)
        MUL     AB              ;  SAVE RESULT TO R4:R5
        MOV     RG5,A
        MOV     R5,B
        MOV     A,RG0
        MOV     B,RG4
        MUL     AB
        ADD     A,R5
        MOV     R5,A
        MOV     A,#00H
        ADDC    A,B
```

```
              MOV     R4,A
              MOV     A,RG4
              CPL     A                    ;01:00-RG4
              INC     A
              MOV     RG4,A
              MOV     A,RG3
              MOV     B,RG4
              MUL     AB
              ADD     A,RG5
              MOV     RG5,A
              MOV     A,R5
              ADDC    A,B
              MOV     R5,A
              MOV     A,#00H
              ADDC    A,R4
              MOV     R4,A
              MOV     A,RG2
              MOV     B,RG4
              MUL     AB
              ADD     A,R5
              MOV     R5,A
              MOV     A,R4
              ADDC    A,B
              MOV     R4,A
              MOV     A,RG5
              RLC     A                    ;ROUNDING THE 3RD BYTE OF RESULT
              MOV     A,#00H
              ADDC    A,R5
              MOV     R5,A
              MOV     A,#00H
              ADDC    A,R4
              MOV     R4,A
              RET
      DATTN:  NOP                          ; Dynamic gain scalar for A/D input
              RET
      IATTN:  NOP
              RET
      DELAY:  NOP
              RET
      ;
      ;****************************************************************
      ;       EXTERNAL INTERRUPT 0 SERVICE ROUTINE                     *
      ;****************************************************************
      I0SVC:  PUSH    PSW                  ;
              PUSH    ACC
              PUSH    DPH
              MOV     RG7,R1
              CLR     AA17
              MOV     DPH,#EN_AD1          ;
              MOVX    A,@DPTR
              MOV     ADB1,A
              MOV     DPH,#EN_AD2          ;
              MOVX    A,@DPTR
              MOV     ADB2,A
              JNB     FINSH,I0SVC3
              MOV     A,R7
              MOV     R1,A
              MOV     @R1,ADB1
              MOV     A,ADB2
              JNB     DLYFL,I0SVC2
              XCH     A,@R0
      I0SVC1: INC     R0
```

```
                DJNZ    ACRC,I0SVC2
                MOV     R0,#80H
                MOV     ACRC,DLYT
        I0SVC2: MOV     RG6,A
                MOV     A,R1
                ADD     A,#10H
                MOV     R1,A
                MOV     @R1,RG6
                INC     R7
                CJNE    R7,#0F0H,I0SVC3
                MOV     R7,#0E0H
                SETB    CIRCL
        I0SVC3: MOV     R1,RG7
                POP     DPH
                POP     ACC
                POP     PSW             ;
                RETI                    ;RETURN FROM INTERRUPT
        ;**************************************************************
        ;       TIMER 0 OVERFLOW INTERRUPT SERVICE ROUTINE            *
        ;       INPUT   : TXEND                                       *
        ;       OUTPUT  : HALF & SECOND  = UP                         *
        ;                 SECOND, HALF   = 0        WDPASS = 1        *
        ;PASS 1 SEC? RESET SEC COUNTER & SET WATCHDOG PASS 1SEC FLAG  *
        ;**************************************************************
        T0SVC:  CLR     TR0             ;DISABLE TIMER 0
                PUSH    PSW             ;SAVE PSW
                PUSH    ACC             ;SAVE A
                PUSH    DPH
                INC     HALF            ;BUMP 500MS COUNTER
                MOV     A,HALF          ;
                CJNE    A,#0AH,T0SVC2   ;WHETHER 500MS LIMIT COMM GAP?
                MOV     HALF,#00H       ;RESET 500MS COUNTER
        T0SVC2: INC     SECOND          ;BUMP SECOND COUNTER
                MOV     A,SECOND        ;
                CJNE    A,#20H,T0SVC3   ;1 SECOND LIMIT WATCH-DOG TIMER?
                MOV     SECOND,#00H     ;RESET SECOND COUNTER
                CPL     WDARM           ;ARM WATCH-DOG TIMER
                SETB    AA17
                MOV     A,30H
                CPL     A
                MOV     DPH,#LED2
                MOVX    @DPTR,A
                MOV     30H,A
                CLR     AA17
        T0SVC3: POP     DPH
                POP     ACC             ;RETREIVE A
                POP     PSW             ;RETREIVE PSW
                SETB    TR0             ;ENABLE TIMER 0
                RETI                    ;RETURN FROM INTERRUPT
        ;**************************************************************
        ;       TIMER 1 OVERFLOW INTERRUPT SERVICE ROUTINE            *
        ;**************************************************************
        T1SVC:  JB      MS50,T1SVC1     ;IF 100 uSEC?
                SETB    MS50            ;
                RETI                    ;
        T1SVC1: CLR     EX0             ;
                CLR     TR1             ;
                PUSH    PSW             ;
                PUSH    ACC
                PUSH    DPH
                JB      FINSH,T1SVC2
                MOV     DPTR,#TONE
```

−43−

```
                MOV     A,R7
                MOVC    A,@A+DPTR
                MOV     DPH,#FRQ        ;SELECT DAC
                CPL     A
                MOVX    @DPTR,A         ;TEST TONE OUTPUT
        T1SVC2: CLR     AA17
                MOV     DPH,#EN_AD1
                MOVX    @DPTR,A
                CLR     MS50
                POP     DPH
                POP     ACC             ;
                POP     PSW
                SETB    TR1             ;
                SETB    EX0             ;
                RETI                    ;
;***********************************************************************
;               LOOK-UP TABLE FOR LOG(X) AND LOG(Y)                     *
;***********************************************************************
        LKT1:   ;INTEGER BYTE
                DB      0,0,20,32,40,47,52,57,61,64,67,70,72,75,77,79
                DB      81,83,84,86,87,89,90,92,93,94,95,96,97,98,99,100
                DB      101,102,103,104,105,105,106,107,108,109,110,111,111,112,113
                DB      113,114,114,115,115,116,117,117,118,118,119,119,120,120,121,121
                DB      122,122,122,123,123,124,124,125,125,125,126,126,127,127,127,128
                DB      128,128,129,129,130,130,130,131,131,131,132,132,132,133,133,133
                DB      133,134,134,134,135,135,135,136,136,136,136,137,137,137,138
                DB      138,138,139,139,139,139,140,140,140,140,141,141,141,141,141,142
                DB      142,142,142,143,143,143,143,143,144,144,144,144,145,145,145,145
                DB      145,146,146,146,146,146,147,147,147,147,147,148,148,148,148,148
                DB      148,149,149,149,149,149,150,150,150,150,150,150,151,151,151,151
                DB      151,151,152,152,152,152,152,152,153,153,153,153,153,153,154,154
                DB      154,154,154,154,154,155,155,155,155,155,155,155,156,156,156,156
                DB      156,156,156,157,157,157,157,157,157,157,157,158,158,158,158,158
                DB      158,158,159,159,159,159,159,159,159,159,160,160,160,160,160,160
                DB      160,160,161,161,161,161,161,161,161,161,162,162,162,162,162,162
        LKT2:   ;HIGH FRACTIONAL BYTE
                DB      0,0,88,62,176,61,151,29,8,125,149,97,239,72,117,124
                DB      97,40,214,108,237,92,185,7,71,122,161,188,206,213,212,202
                DB      185,160,128,90,46,252,196,135,70,255,180,101,18,187,96,1
                DB      160,58,210,103,249,136,21,158,38,171,45,174,44,168,35,155
                DB      17,134,248,105,217,70,178,29,134,238,84,185,28,127,224,63
                DB      158,251,87,178,12,101,189,20,106,191,19,102,184,9,90,169
                DB      248,70,147,223,43,117,191,9,81,153,224,39,109,178,247,59
                DB      126,193,3,69,134,198,6,70,132,195,1,62,123,183,243,46
                DB      105,164,222,23,81,137,194,249,49,104,159,213,11,64,117,170
                DB      222,18,70,121,172,223,17,67,117,166,215,8,56,104,152,199
                DB      246,37,83,130,176,221,11,56,101,145,190,234,22,65,108,151
                DB      194,237,23,65,107,149,190,231,16,57,97,138,178,218,1,41
                DB      80,119,158,197,235,17,55,93,131,168,206,243,24,60,97,133
                DB      169,206,241,21,57,92,127,162,197,232,10,45,79,113,147,181
                DB      214,248,25,58,91,124,157,190,222,254,30,63,94,126,158,189
                DB      221,252,27,58,89,120,150,181,211,241,15,45,75,105,135,164
        LKT3:   ;LOW FRACTIONAL BYTE
                DB      0,0,69,234,139,59,47,119,208,212,129,169,117,229,189,38
                DB      22,158,26,92,198,98,238,240,187,119,42,191,2,175,107,205
                DB      91,147,227,179,95,63,162,207,12,150,167,118,52,16,54,207
                DB      0,239,188,136,112,145,4,228,72,70,245,103,177,228,18,76
                DB      161,32,216,215,41,219,248,141,165,73,133,97,231,32,21,205
                DB      82,169,220,240,237,217,188,154,121,97,86,93,124,183,20,152
                DB      70,36,53,125,2,198,206,28,182,157,214,100,74,139,42,42
                DB      142,88,140,44,58,186,173,21,246,82,42,128,88,178,146,248
                DB      231,96,102,250,30,212,29,250,111,123,32,97,62,185,211,142
```

```
        DB  235,235,143,217,203,100,167,148,45,115,102,8,91,94,19,123
        DB  151,104,239,44,33,207,53,86,50,202,31,49,1,144,223,238
        DB  191,81,167,191,155,60,162,206,193,123,253,71,90,54,221,79
        DB  140,148,105,11,122,183,195,158,72,193,12,39,19,210,98,197
        DB  251,5,227,149,28,120,170,177,144,68,208,52,111,131,111,53
        DB  211,76,158,202,210,180,114,11,128,209,255,10,242,184,91,220
        DB  60,122,151,148,111,43,198,65,157,218,248,247,215,153,61,196
;****************************************************************
;                        PEAK VALUE                              *
;****************************************************************
PEAK:   DB  02H,05H,04H,03H,06H        ;PEAK VALUE
        DB  03H,06H,03H,04H,05H
;****************************************************************
;                        TEST TONE                               *
;****************************************************************
TONE:   DB  80H,0D4H,0EAH,0BBH         ;TEST TONE
        DB  7DH,6CH,91H,0BBH,0B0H,67H  ;
        DB  18H,02H,3AH,8EH,0BCH       ;
        DB  0A8H,79H,6CH,99H,0D9H      ;
        DB  0EBH,0B2H,54H,18H,27H      ;
        DB  65H,91H,84H,54H,3FH        ;
        DB  6BH,0C1H,0FCH,0EAH         ;
        DB  9DH,54H,48H,71H,95H,86H    ;
        DB  44H,13H,26H                ;
        END;
```

What is claimed is:

1. A signal regulator for regulating an auxiliary signal based upon a primary signal scaled by an audio amplifier, said signal regulator comprising:

a primary signal input for receiving the primary signal with a level;

processing circuitry connected to said primary signal input for monitoring the level of the primary signal and for defining an unscaled level of the primary signal based on said monitored level;

a primary signal output connected to said processing circuitry for providing the primary signal to the amplifier, the amplifier for scaling the level of the primary signal and for providing the primary signal with a scaled level;

a scaled primary signal input for receiving the primary signal with the scaled level from the amplifier, said scaled primary signal input being connected to said processing circuitry;

said processing circuitry for:
monitoring the scaled level of the primary signal, and generating a gain factor based upon the unscaled level and the scaled level of the primary signal, said gain factor representing the amount of gain effected in the amplifier on said primary signal;

an auxiliary signal input for receiving the auxiliary signal;

adjusting circuitry connected to said auxiliary signal input and to said processing circuitry for:
receiving said gain factor;
adjusting a level of the auxiliary signal proportional to said gain factor; and
providing the auxiliary signal with an adjusted level; and an auxiliary signal output connected to said adjusting circuitry for providing the auxiliary signal with the adjusted level.

2. A signal regulator as claimed in claim 1 further comprising:

a scaled primary signal output connected to said processing circuitry for providing the primary signal with the scaled level.

3. A signal regulator as claimed in claim 1 wherein:

said primary signal input receives a source signal, the source signal including a plurality of primary signals; and said signal regulator further comprises a plurality of primary signal outputs connected to said processing circuitry, each of said primary signal outputs for providing a respective primary signal.

4. A signal regulator as claimed in claim 1 further comprising:

a plurality of auxiliary signal inputs each for receiving a plurality of auxiliary signals, said adjusting circuitry connected to said plurality of auxiliary inputs for adjusting a level of said plurality of auxiliary signals based upon said gain factor and for providing said plurality of auxiliary signals each with an adjusted level; and a plurality of auxiliary signal outputs connected to said adjusting circuitry each for providing a respective one of said plurality of auxiliary signals.

5. A signal regulator as claimed in claim 1 wherein said processing circuitry generates said gain factor to be substantially equal to a difference in gain between the unscaled level and the scaled level of the primary signal.

6. A signal regulator as claimed in claim 5 wherein said adjusting circuitry adjusts the level of the auxiliary signal by an amount substantially equal to said gain factor.

7. A signal regulator as claimed in claim 1 wherein the primary signal and the auxiliary signal are audio signals;

said processing circuitry generating said gain factor to be substantially equal to a difference in a gain between the unscaled level and the scaled level of the primary signal; and said adjusting circuitry adjusting the level of the auxiliary signal by said gain factor.

8. A signal regulator as claimed in claim 1 wherein the amplifier is included in a home-theater system, the primary signal is a front-channel audio signal, and the auxiliary signal is a surround sound-channel audio signal;

said processing circuitry generating said gain factor to be substantially equal to a difference in a gain between the unscaled level and the scaled level of the primary signal; and said adjusting circuitry adjusting the level of the auxiliary signal by said gain factor.

9. A signal regulator as claimed in claim 1 wherein the amplifier is included in a receiver with a volume control, the primary signal and the auxiliary signal are audio signals, the amplifier amplifying the primary signal in response to changes in the volume control;

said processing circuitry continuously monitoring the scaled level of the primary signal and generating said gain factor to be substantially equal to a difference in a gain between the unscaled level and the scaled level of the primary signal; and said adjusting circuitry adjusting the level of the auxiliary signal by said gain factor.

10. A signal regulator as claimed in claim 9 wherein the amplifier amplifies the primary signal such that the scaled level thereof is greater than the unscaled level thereof;

said processing circuitry generating said gain factor to be greater than 1.0; and said adjusting circuitry amplifying the level of the auxiliary signal substantially by said gain factor.

11. A signal regulator as claimed in claim 9 wherein the amplifier attenuates the primary signal such that the scaled level thereof is less than the unscaled level thereof;

said processing circuitry generating said gain factor to be less than 1.0; and said adjusting circuitry attenuating the level of the auxiliary signal substantially by said gain factor.

12. A method for regulating an auxiliary signal based upon a primary signal scaled by an audio amplifier, said method comprising the steps of:

receiving the primary signal with a level;

monitoring the level of the primary signal;

defining said monitored level as a unscaled level of the primary signal;

providing the primary signal to the amplifier;

receiving the primary signal with a scaled level from the amplifier;

monitoring the scaled level of the primary signal;

generating a gain factor based on the unscaled level and the scaled level of the primary signal, said gain factor representing the amount of gain effected in the amplifier on said primary signal;

receiving the auxiliary signal;

adjusting a level of the auxiliary signal proportional to said gain factor; and providing the auxiliary signal with said adjusted level.

13. A method as claimed in claim 12 further comprising the step of:

determining whether the primary signal changes phase at the amplifier.

14. A method as claimed in claim 13 further comprising the step of:

regulating a phase of the auxiliary signal responsive to whether the primary signal changed phase at the amplifier.

15. A method as claimed in claim 12 further comprising the steps of:

defining the primary signal with the scaled level as a feedback signal;

calculating a delay between the primary signal with the unscaled level and the feedback signal.

16. A method as claimed in claim 15 wherein said calculating step comprises the steps of:

generating a test tone of known data;

combining said test tone with the primary signal prior to providing the primary signal to the amplifier; and comparing sample data of the feedback signal with said known data until a match is located.

17. A method as claimed in claim 12 further comprising the steps of:

defining the primary signal with the scaled level as a feedback signal;

correlating the primary signal with the unscaled level and the feedback signal.

18. A method as claimed in claim 17 further comprising the steps of:

determining whether a correlation between the primary signal with the unscaled level and the feedback signal is greater than a predetermined threshold;

counting a number of times said correlation is consecutively greater than said threshold.

19. A method as claimed in claim 18 further comprising the step of:

performing said adjusting step when said correlation is consecutively greater than said threshold for a predetermined number of times.

20. A surround-sound audio system with automatic volume control of the volume of a plurality of surround-sound channels, said audio system comprising:

a receiver including an amplifier, a volume control, front channel inputs, and front channel outputs;

an electronic component for providing a source signal;

a volume-tracking system including:

a source signal input connected to said electronic component for receiving the source signal;

processing circuitry connected to said source signal input for decoding the source signal into front channel signals and surround-sound signals, for monitoring a level of the front channel signals, and for defining a unscaled level of the front channel signals based on said monitored level;

front channel signal outputs connected to said front channel inputs of said receiver for providing the front channel signals to the amplifier, said receiver for scaling the level of the front channel signals with said amplifier based on said volume control and for providing the front channel signals with a scaled level to said front channel outputs thereof;

scaled front channel signal inputs connected to said front channel outputs of said receiver for receiving the front channel signals with the scaled level, said scaled front channel signal inputs being connected to said processing circuitry;

said processing circuitry for:

monitoring the scaled level of the front channel signals, and generating a gain factor based upon the unscaled level and the scaled level of the front channel signals;

adjusting circuitry connected to said processing circuitry for:

receiving said gain factor;

adjusting a level of the surround-sound signals based upon said gain factor; and providing the surround-sound signals with an adjusted level;

surround-sound signal outputs connected to said adjusting circuitry for providing the surround-sound signals with the adjusted level; and front channel signal outputs connected to said scaled front channel signal inputs for providing the front channel signals with the scaled level;

front channel speakers connected to said front channel signal outputs of said volume-tracking system for receiving the front channel signals with the scaled level; and surround-sound speakers connected to said surround-sound signal outputs of said volume-tracking system for receiving the surround-sound signals with the adjusted level.

21. A system for determining a gain factor that is indicative of the amount an audio amplifier scales a primary signal, said system comprising:

a primary signal input for receiving the primary signal with a level;

processing circuitry connected to said primary signal input for determining an unscaled level of the primary signal;

a primary signal output connected to said processing circuitry for providing the primary signal to the amplifier, the amplifier for scaling the level of the primary signal and for providing the primary signal with a scaled level;

a scaled primary signal input for receiving the primary signal with the scaled level from the amplifier, said scaled primary signal input being connected to said processing circuitry;

said processing circuitry for generating a gain factor based upon the unscaled level and the scaled level of the primary signal only, said gain factor representing the amount of gain effected in the amplifier on said primary signal;

an auxiliary signal input for receiving an auxiliary signal;

adjusting circuitry connected to said auxiliary signal input and to said processing circuitry, said adjusting circuitry for:

receiving said gain factor;

adjusting a level of the auxiliary signal based upon said gain factor; and providing the auxiliary signal with an adjusted level; and an auxiliary signal output connected to said adjusting circuitry for providing the auxiliary signal with the adjusted level.

22. A method for determining a gain factor that is indicative of the amount an audio amplifier scales a primary signal, said method comprising the steps of:

determining an unscaled level of a primary signal provided to the amplifier;

determining a scaled level of the primary signal received from the amplifier;

generating a gain factor based on the unscaled level and the scaled level of the primary signal only, said gain factor representing the amount of gain effected in the amplifier on said primary signal;

receiving an auxiliary signal; and adjusting a level of the auxiliary signal based upon said gain factor.

* * * * *